United States Patent
Okajima et al.

(10) Patent No.: US 9,721,961 B2
(45) Date of Patent: Aug. 1, 2017

(54) SEMICONDUCTOR MEMORY DEVICE

(71) Applicant: KABUSHIKI KAISHA TOSHIBA, Tokyo (JP)

(72) Inventors: Mutsumi Okajima, Yokkaichi (JP); Atsushi Oga, Yokkaichi (JP); Takeshi Yamaguchi, Yokkaichi (JP); Hiroyuki Ode, Yokkaichi (JP); Toshiharu Tanaka, Yokkaichi (JP); Natsuki Fukuda, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/970,082

(22) Filed: Dec. 15, 2015

(65) Prior Publication Data
US 2016/0351628 A1 Dec. 1, 2016

Related U.S. Application Data

(63) Continuation-in-part of application No. 14/850,527, filed on Sep. 10, 2015.

(60) Provisional application No. 62/168,496, filed on May 29, 2015.

(51) Int. Cl.
*H01L 27/24* (2006.01)
*H01L 45/00* (2006.01)
*H01L 27/11565* (2017.01)

(52) U.S. Cl.
CPC ...... *H01L 27/11565* (2013.01); *H01L 27/249* (2013.01); *H01L 27/2427* (2013.01);
(Continued)

(58) Field of Classification Search
CPC ............ H01L 29/7926; H01L 29/7889; H01L 29/7827; H01L 29/66666; H01L 29/78642; H01L 27/0688; H01L 27/11551; H01L 21/8221; H01L 27/11578; H01L 45/1233; H01L 2225/06555; G11C 5/025; G11C 2213/79; G06F 17/5068; G06F 11/1068; G06F 11/1666
See application file for complete search history.

(56) References Cited

U.S. PATENT DOCUMENTS 7,800,091 B2 9/2010 Kamigaichi et al.
7,910,914 B2 3/2011 Tanaka et al.
(Continued)

FOREIGN PATENT DOCUMENTS

JP 2008-277543 11/2008
TW 200715482 A 4/2007
(Continued)

OTHER PUBLICATIONS

Office Action mailed Nov. 17, 2016 in U.S. Appl. No. 14/850,527.
Office Action issued Mar. 14, 2017 for Taiwanese Patent application No. 105115215.

*Primary Examiner* — Tom Thomas
*Assistant Examiner* — John Bodnar
(74) *Attorney, Agent, or Firm* — Oblon, McClelland, Maier & Neustadt, L.L.P.

(57) ABSTRACT

In this semiconductor memory device, the first conducting layers are arrayed laminated in a first direction, and extend in a second direction intersecting with the first direction. The first conducting layers are arrayed in a third direction via interlayer insulating films. The third direction intersects with the first direction and the second direction. The interlayer insulating film is disposed between the first conducting layers arrayed in the third direction, and extends in the first direction. The second conducting layer is disposed between the first conducting layers arrayed in the third direction, and extends in the first direction. The second conducting layer has an approximately circular cross-sectional shape intersecting with the first direction. The variable resistance layer surrounds a peripheral area of the second conducting layer, and is disposed at a position between the second conducting layer and the first conducting layer.

18 Claims, 21 Drawing Sheets

(52) U.S. Cl.
CPC ...... *H01L 27/2454* (2013.01); *H01L 27/2481* (2013.01); *H01L 45/06* (2013.01); *H01L 45/1253* (2013.01); *H01L 45/16* (2013.01)

(56) References Cited

U.S. PATENT DOCUMENTS

| | | |
|---|---|---|
| 8,138,489 B2 | 3/2012 | Tanaka et al. |
| 8,258,038 B2 | 9/2012 | Nozawa |
| 8,283,711 B2 | 10/2012 | Jin et al. |
| 8,350,314 B2 | 1/2013 | Fukuzumi et al. |
| 9,006,793 B2 | 4/2015 | Wei et al. |
| 2008/0149913 A1* | 6/2008 | Tanaka ................ H01L 27/2454 257/5 |
| 2010/0202206 A1* | 8/2010 | Seol ................... G11C 16/0408 365/185.17 |
| 2012/0104351 A1* | 5/2012 | Wei ..................... H01L 27/2409 257/4 |
| 2014/0326939 A1 | 11/2014 | Yamato et al. |
| 2015/0179659 A1* | 6/2015 | Takaki .............. H01L 21/76895 257/5 |

FOREIGN PATENT DOCUMENTS

| | | |
|---|---|---|
| TW | 201503290 A | 1/2015 |
| WO | WO 2011/016196 A1 | 2/2011 |
| WO | WO 2012/001960 A1 | 1/2012 |

\* cited by examiner

SEMICONDUCTOR MEMORY DEVICE

This application is based on and claims the benefit of priority from prior U.S. provisional Patent Application 62/168,496, filed on May 29, 2015, and U.S. non-provisional patent application Ser. No. 14/850,527, filed on Sep. 10, 2015, the entire contents of which are incorporated herein by reference.

FIELD

Embodiments described herein relate generally to a semiconductor memory device and a method of manufacturing the semiconductor memory device.

BACKGROUND

Recently, in association with highly integrated semiconductor memory devices, LSI devices constituting the semiconductor memory devices have been increasingly minute. For miniaturization of this LSI device, it is requested to improve dimensional accuracy and position accuracy of a circuit pattern in addition to simply thinning a line width. As a technique to overcome such problem, there has been proposed a Resistive RAM (ReRAM) that uses variable resistive elements, which reversibly change a resistance value, as a memory. This ReRAM includes the variable resistive element between a sidewall of a word line extending parallel to a substrate and a sidewall of a bit line extending perpendicular to the substrate. This structure ensures further highly integrated memory cell array.

In the ReRAM having the bit lines extending perpendicular to the substrate, a resistance change film constituting the variable resistive element is formed at the sidewall of the bit line. However, forming this resistance change film without causing a process damage is not easy.

BRIEF DESCRIPTION OF THE DRAWINGS

FIG. 3 is viewed from an X direction;

DETAILED DESCRIPTION

A semiconductor memory device according to the following embodiments includes first conducting layers, a memory layer, and second conducting layers. The first conducting layers are laminated at predetermined pitches in a first direction perpendicular to a substrate. The first conducting layers extend in a second direction parallel to the substrate. The memory layer is disposed on lateral faces of the plurality of first conducting layers in common. The memory layers function as memory cells. The second conducting layers are in contact with the lateral faces of the first conducting layers via the memory layers. The memory layers are disposed to cover lateral faces of the second conducting layers over a whole circumference in a closed-loop shape.

A semiconductor memory device according to the following embodiments includes a plurality of first conducting layers. The first conducting layers are arrayed laminated in a first direction, and extend in a second direction intersecting with the first direction. The first conducting layers are arrayed in a third direction via interlayer insulating films. The third direction intersects with the first direction and the second direction. The interlayer insulating film is disposed between the first conducting layers arrayed in the third direction. The interlayer insulating film extends in the first direction. The second conducting layer is disposed between the first conducting layers arrayed in the third direction. The second conducting layer extends in the first direction. The second conducting layer has an approximately circular cross-sectional shape intersecting with the first direction. The variable resistance layer surrounds a peripheral area of the second conducting layer. The variable resistance layer is disposed at a position between the second conducting layer and the first conducting layer.

Next, the following describes a semiconductor memory device and a method of manufacturing the semiconductor memory device according to embodiments in detail with reference to the accompanying drawings.

First Embodiment

Figure 1:
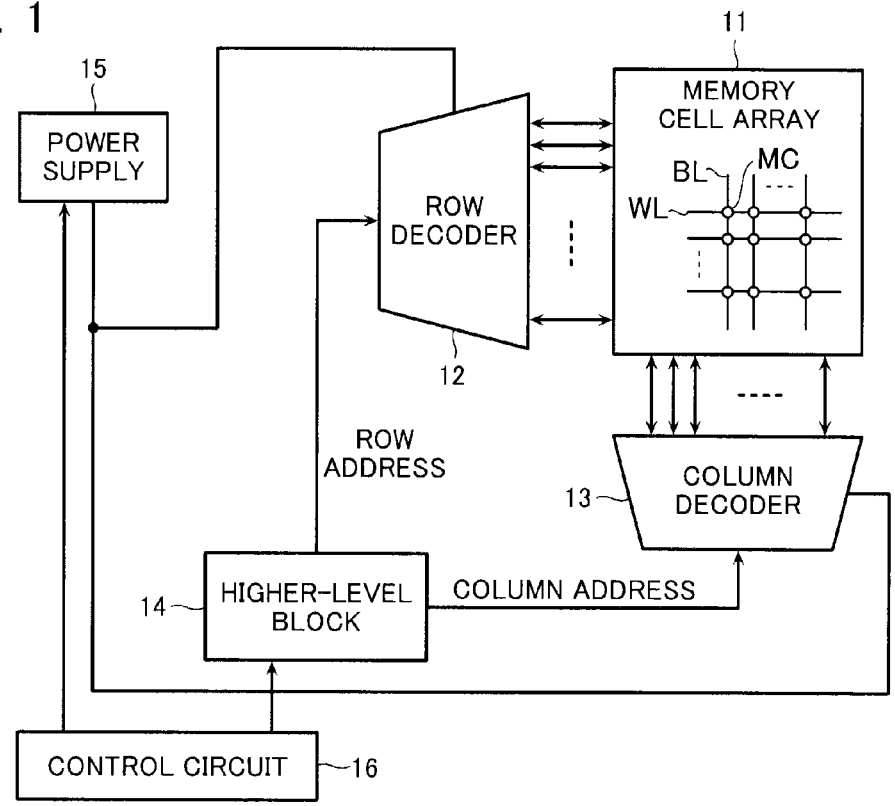
FIG. 1 is an exemplary block diagram of a semiconductor memory device according to a first embodiment.

First, the following describes an overall configuration of a semiconductor memory device according to the first embodiment. FIG. 1 is an exemplary block diagram of the semiconductor memory device according to the first embodiment. As illustrated in FIG. 1, the semiconductor memory device includes a memory cell array 11, a row decoder 12, a column decoder 13, a higher-level block 14, a power supply 15, and a control circuit 16.

The memory cell array 11 includes a plurality of word lines WL and bit lines BL, which intersect with one another, and memory cells MC, which are disposed in the respective intersecting portions of these lines. The row decoder 12 selects the word line WL for access (data erasing/writing/reading). The column decoder 13 includes a driver that selects the bit line BL for access to control an access operation.

The higher-level block 14 selects the memory cell MC in the memory cell array 11 to be accessed. The higher-level block 14 gives a row address and a column address to the row decoder 12 and the column decoder 13, respectively. The power supply generates combinations of predetermined voltages corresponding to the respective operations of data erasing/writing/reading and supplies the combinations to the row decoder 12 and the column decoder 13. The control circuit 16 performs a control such as transmission of an address to the higher-level block 14 in response to an external command and controls the power supply 15.

Figure 2:
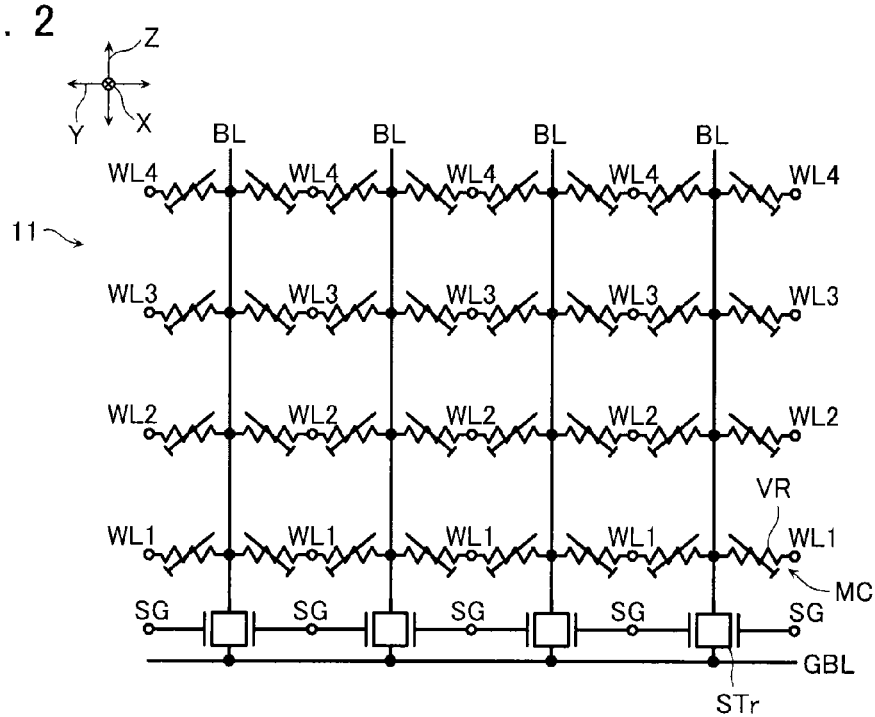
FIG. 2 is an exemplary circuit diagram of a memory cell array 11 according to the first embodiment.
Figure 3:
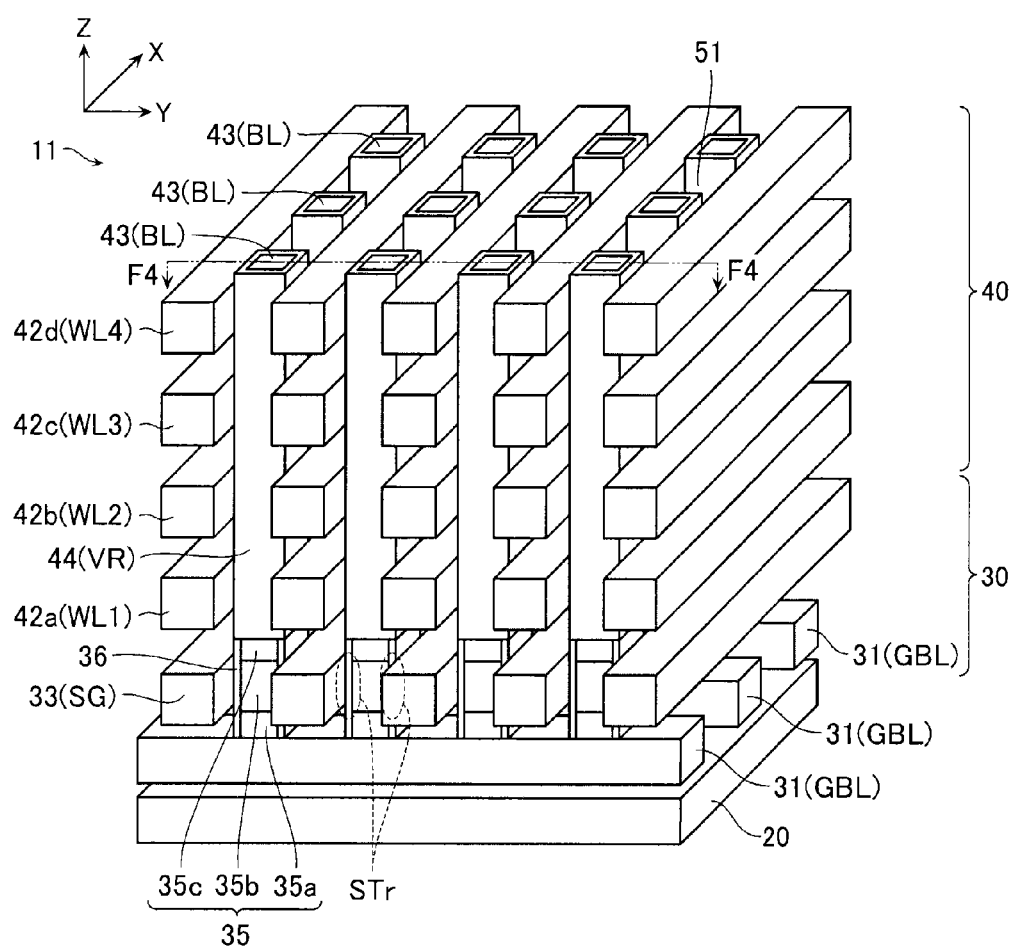
FIG. 3 is an exemplary perspective view illustrating a laminated structure of the memory cell array 11 according to the first embodiment.

The following describes the memory cell array 11 according to the first embodiment in detail with reference to FIG. 2 and FIG. 3. FIG. 2 is an exemplary circuit diagram of the memory cell array 11. FIG. 3 is an exemplary perspective view illustrating the laminated structure of the memory cell array 11. In FIG. 2, the X direction, the Y direction, and the Z direction are mutually orthogonal. The X direction is a direction the perpendicular to the paper. The structures illustrated in FIG. 2 are continuously disposed in the X direction. In FIG. 3, an interlayer insulating film is actually formed between the respective wirings. However, for simplification of the drawing, FIG. 3 omits the illustration of the interlayer insulating film.

As illustrated in FIG. 2, the memory cell array 11 includes selection transistors STr, global bit lines GBL, and selection gate lines SG in addition to the above-described word lines WL, bit lines BL, and memory cells MC.

As illustrated in FIG. 2 and FIG. 3, word lines WL1 to WL4 are disposed at predetermined pitches in the Z direction. The word lines WL1 to WL4 are disposed so as to extend in the X direction as its longitudinal direction. The bit lines BL are disposed in a matrix in the X direction and the Y direction. The bit lines BL are formed so as to extend in the Z direction as its longitudinal direction. The memory cells MC are disposed at portions where these word lines WL and bit lines BL intersect. Accordingly, the memory cells MC are disposed in a three-dimensional matrix, the X direction, the Y direction, and the Z direction in the memory cell array 11. In various operations, an identical voltage is applicable to the selected word line WL among the word lines WL1 to WL4, regardless of the position in the Z direction. An identical voltage is applicable to the non-selected word line WL among the word lines WL1 to WL4, regardless of the position in the Z direction.

As illustrated in FIG. 2, the memory cell MC includes a variable resistive element VR. The memory cell MC including the variable resistive element VR is electrically rewritable. The memory cell MC stores data in a non-volatile manner based on the resistance value given to the variable resistive element VR. The variable resistive element VR changes from the high resistance state (a reset state) to the low resistance state (a setting state) by a setting operation. The setting operation applies a voltage at a certain magnitude or more to both ends of the variable resistive element VR. The variable resistive element VR changes from the low resistance state (the setting state) to the high resistance state (the reset state) by a reset operation. The reset operation applies a voltage at a certain magnitude or more to both ends of the variable resistive element VR.

Immediately after the manufacture, the variable resistive element VR is in a state of not easily changing its resistance state and in the high resistance state. Therefore, a forming operation, which applies a high voltage equal to or more than the setting operation and the reset operation to both ends of the variable resistive element VR, is performed. This forming operation forms a region where a current is likely to locally flow in the variable resistive element VR (a filament path). This allows the variable resistive element VR to easily change the resistance state, being an operable state as a storage element.

As illustrated in FIG. 2, the selection transistor STr is disposed between the one end of the bit line BL and the global bit line GBL. The global bit lines GBL are disposed at predetermined pitches in the X direction. The global bit lines GBL are formed so as to extend in the Y direction as its longitudinal direction. The one global bit line GBL is connected to the one end portion of the plurality of selection transistors STr, which are disposed in a line in the Y direction, in common. A gate electrode of the two selection transistors STr, which are adjacently disposed in the Y direction, is connected in common.

The selection gate lines SG are disposed at predetermined pitches in the Y direction. The selection gate lines SG are formed so as to extend in the X direction as its longitudinal direction. The one selection gate line SG is connected to the gates of the plurality of selection transistors STr, which are disposed in a line in the X direction, in common. The gate electrode of the two selection transistors STr, which are adjacently disposed in the Y direction, can be separated. Thus, the two selection transistors STr each can be independently operated.

Figure 4:
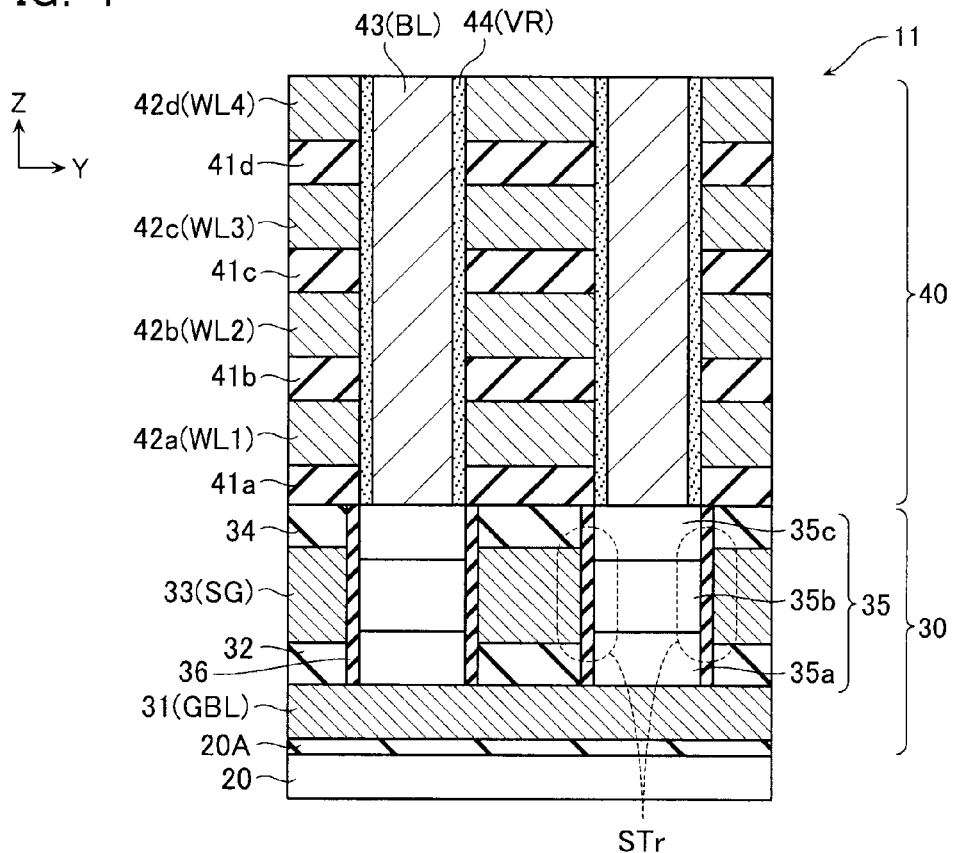
FIG. 4 is a drawing when
Figure 5:
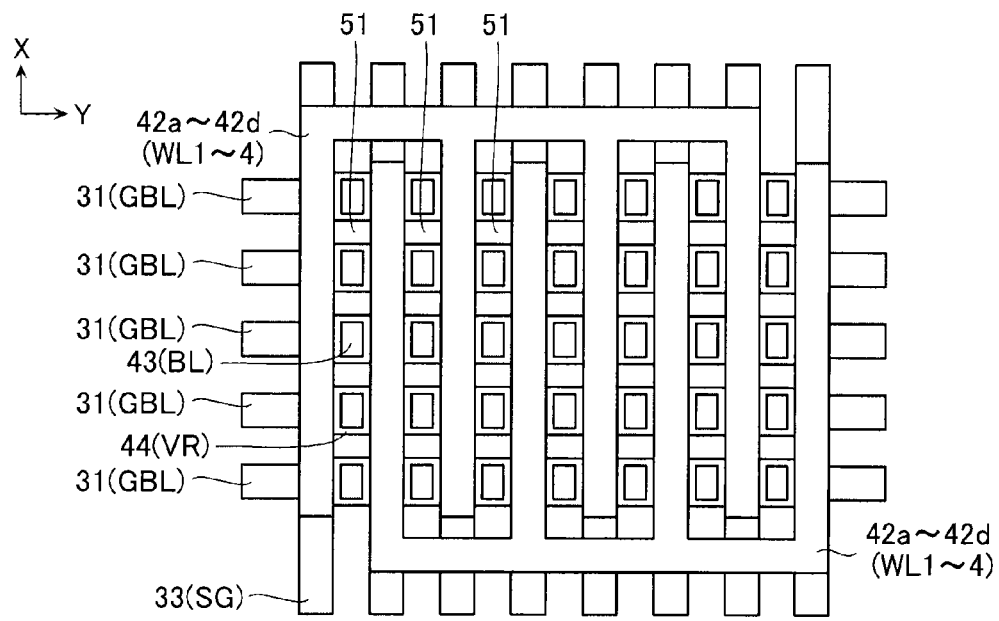
FIG. 5 is a top view of FIG. 3.

The following describes the laminated structure of the memory cell array 11 according to the first embodiment with reference to FIG. 3, FIG. 4, and FIG. 5. FIG. 4 is a drawing when the F4-F4 plane in FIG. 3 is viewed from the X direction (Z-Y plane). FIG. 5 is a top view of FIG. 3. FIG. 3 and FIG. 5 omit an interlayer insulating layer.

The memory cell array 11, as illustrated in FIG. 3 and FIG. 4, includes a selection transistor layer 30 and a memory layer 40 laminated over a substrate 20. The selection transistor layer 30 functions as the selection transistor STr. The memory layer 40 functions as the memory cell MC.

As illustrated in FIG. 3 and FIG. 4, the selection transistor layer 30 includes conducting layers 31, interlayer insulating films 32, conducting layers 33, and interlayer insulating films 34. These conducting layers 31, interlayer insulating films 32, conducting layers 33, and interlayer insulating films 34 are laminated in the Z direction, which is perpendicular to the substrate 20. The conducting layer 31 functions as the global bit line GBL while the conducting layer 33 functions as the gate of the selection gate line SG and the selection transistor STr.

The conducting layers 31 are disposed at predetermined pitches in the X direction, which is parallel to the substrate 20, via an interlayer insulating film 20A. The conducting layers 31 are formed so as to extend in the Y direction as its longitudinal direction (see FIG. 4). The interlayer insulating films 32 cover the top surfaces of the conducting layers 31. The conducting layers 33 are disposed at predetermined pitches in the Y direction. The conducting layers 33 are formed so as to extend in the X direction as its longitudinal direction (see FIG. 4). The interlayer insulating films 34 cover the lateral faces and the top surface of the conducting layer 33. The conducting layers 31 and 33 can be made of, for example, polysilicon. The interlayer insulating films 32 and 34 can be made of silicon oxide ($SiO_2$).

As illustrated in FIG. 3 and FIG. 4, the selection transistor layer 30 includes columnar semiconductor layers 35 and gate insulating layers 36. The columnar semiconductor layer 35 functions as a body (a channel) of the selection transistor STr. The gate insulating layer 36 functions as the gate insulating film of the selection transistor STr.

The columnar semiconductor layers 35 are disposed in a matrix in the X and Y directions. The columnar semiconductor layer 35 has a columnar shape and extends in the Z direction as its longitudinal direction. The columnar semiconductor layer 35 is in contact with the top surfaces of the conducting layers 31. The columnar semiconductor layer 35 is in contact with the lateral face of the conducting layer 33 in the Y direction via the gate insulating layer 36. The columnar semiconductor layer 35 includes an N+ type semiconductor layer 35a, a P+ type semiconductor layer 35b, and an N+ type semiconductor layer 35c, which are laminated.

As illustrated in FIG. 3 and FIG. 4, the lateral face of the N+ type semiconductor layer 35a in the Y direction is in contact with the interlayer insulating film 32. The lateral face of the P+ type semiconductor layer 35b in the Y direction is in contact with the lateral face of the conducting layer 33. The lateral face of the N+ type semiconductor layer 35c in the Y direction is in contact with the interlayer insulating film 34. The N+ type semiconductor layers 35a and 35c can be made of polysilicon into which N+ type impurities are injected. The P+ type semiconductor layer 35b can be made of polysilicon into which P+ type impurities are injected. The gate insulating layer 36 can be made of, for example, silicon oxide ($SiO_2$).

FIG. 3 and FIG. 4 illustrate the example where the selection transistor layer 30 is formed under the memory layer 40. However, instead of this, the selection transistor layer 30 may be disposed on the memory layer 40. That is, the selection transistor STr may be connected to the upper end side of a columnar conducting layer 43.

As illustrated in FIG. 3 and FIG. 4, the memory layer 40 includes interlayer insulating films 41a to 41d and conducting layers 42a to 42d laminated in alternation in the Z direction. The conducting layers 42a to 42d each functions as the word lines WL1 to WL4. Viewed from the Z direction, the conducting layers 42a to 42d have a pair of comb shape each opposed in the X direction (see FIG. 5). The interlayer insulating films 41a to 41d are made of, for example, silicon oxide ($SiO_2$). The conducting layers 42a to 42d are made of, for example, polysilicon or titanium nitride (TiN).

As illustrated in FIG. 3 and FIG. 4, the memory layer 40 includes columnar conducting layers 43 and variable resistance layers 44. The columnar conducting layer 43 functions as the bit line BL. The variable resistance layer 44 functions as the variable resistive element VR.

The columnar conducting layers 43 are disposed in a matrix in the X and Y directions. The lower end of the columnar conducting layer 43 is in contact with the top surface of the columnar semiconductor layer 35. The columnar conducting layer 43 extends in a columnar manner in the Z direction. The variable resistance layer 44 is formed into a closed loop shape over a whole circumference of the columnar conducting layer 43. That is, as illustrated in FIG. 4, the variable resistance layers are disposed along both lateral faces of the columnar conducting layer 43 in the Y direction. As illustrated in FIG. 5, the variable resistance layers 44 are also disposed along both lateral faces of the columnar conducting layer 43 in the X direction (that is, the variable resistance layers 44 are positioned between the columnar conducting layers 43 and interlayer insulating films 51). The variable resistance layer is formed into the closed loop shape over the whole circumference of the columnar conducting layer 43.

However, the variable resistance layer 44 is at least partially removed at a position between the bottom surface of the columnar conducting layer 43 and the columnar semiconductor layer 35. Accordingly, the columnar conducting layer 43 and the columnar semiconductor layer 35 have a part at which the columnar conducting layer 43 and the columnar semiconductor layer 35 are directly connected without the variable resistance layer 44 therebetween. The variable resistance layer 44 is formed into the closed loop shape so as to cover the lateral faces of the columnar conducting layer 43 over the whole circumference thereof. However, as illustrated in FIG. 3 and FIG. 5, the variable resistance layer 44 is not formed at the position between the interlayer insulating film 51 and the conducting layers 42a to 42d. The variable resistance layer 44 is disconnected at the position of this interlayer insulating film 51. The variable resistance layer 44 thus shaped can be obtained by a manufacturing method, which will be described later.

With such shape and manufacturing method of the variable resistance layer 44, the variable resistance layer 44 can be formed without causing the process damage, ensuring improving a yield. The columnar conducting layer 43 is made of a conductive material such as polysilicon, tungsten nitride (WN), tungsten (W), and ruthenium (Ru); or a laminated body of a plurality of kinds of these materials. The variable resistance layer 44 can made of, for example, metal oxide (for example, $HfO_X$, $Al_2O_X$, $TiO_X$, ZrO, AlO, SiOx, $NiO_X$, $WO_X$, and $Ta_2O_X$) and the laminated body of these materials.

Manufacturing Method

Next, the following describes a method of manufacturing the semiconductor memory device according to the first embodiment with reference to FIG. 6 to FIG. 15. FIG. 6 to FIG. 15 are exemplary perspective views illustrating the method of manufacturing the memory cell array 11.

First, the structure of the selection transistor layer is formed on the semiconductor substrate 20. Although specific illustrations are omitted in FIG. 6 and the subsequent drawings, the interlayer insulating film 20A is formed on the semiconductor substrate 20. A metal wiring layer, which will be the global bit line GBL, is deposited on the layer. This metal wiring layer is separated by an isolation insulating film having its longitudinal direction in the Y direction. This forms a plurality of the global bit lines GBL (the conducting layers 31). Then, on the conducting layers 31, the interlayer insulating films 32, and the conducting layers 33 and the interlayer insulating films 34, which are formed having its longitudinal direction in the X direction, are deposited. After that, trenches reaching the conducting layers 31 are formed at predetermined intervals in the X-Y direction. The gate insulating layers 36 and the columnar semiconductor layer 35 are embedded into this trench. This completes the selection transistor layer 30 with the structure illustrated in FIG. 4.

Figure 6:
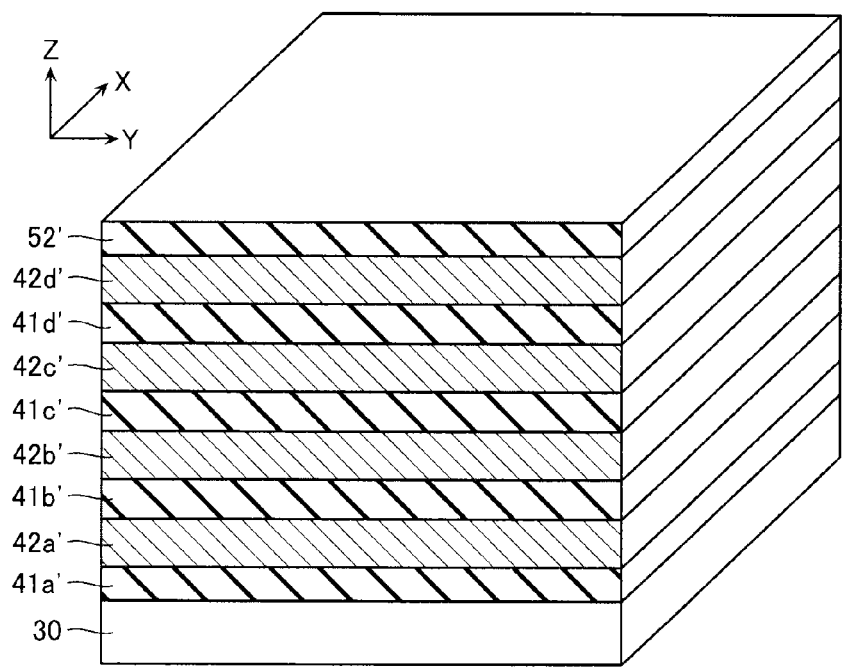
FIG. 6 to FIG. 16 are exemplary perspective views illustrating a method of manufacturing the memory cell array 11 according to the first embodiment.

Next, as illustrated in FIG. 6, the silicon oxide ($SiO_2$) and the polysilicon (Si) are laminated in alternation on the top surface of the selection transistor layer 30. Thus, a laminated body of interlayer insulating films 41a' to 41d' and conducting layers 42a' to 42d' expanding in the X direction and the Y direction are formed. A protecting layer 52' is formed on the conducting layer 42d'.

Figure 7:
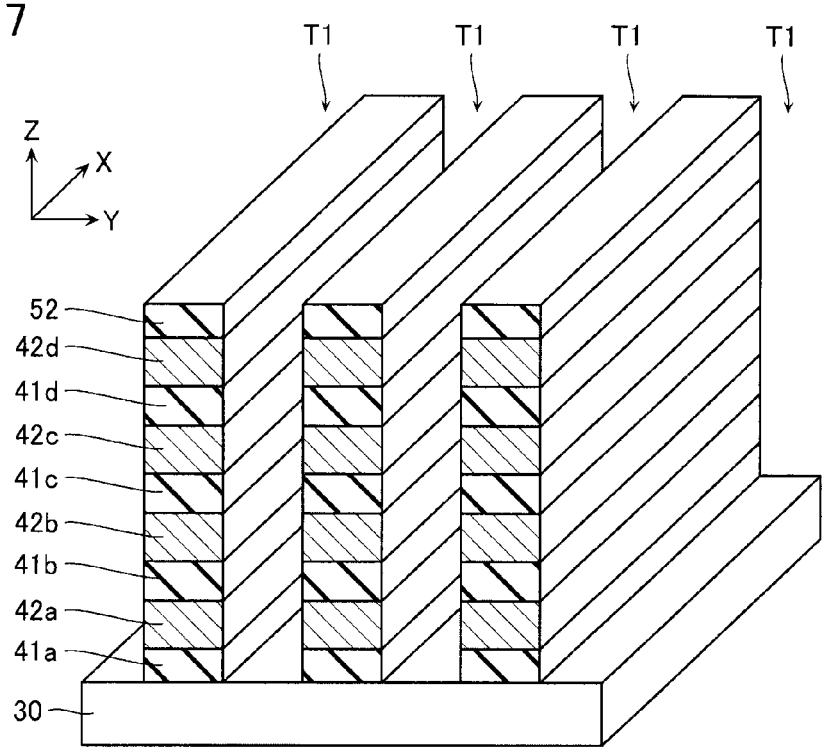

Next, as illustrated in FIG. 7, trenches T1 are formed. The trenches T1 divide the laminated body of the interlayer insulating films 41a' to 41d', the conducting layers 42a' to 42d', and the protecting layer 52' into a plurality of stripe-shaped laminated bodies. The trenches T1 are disposed at predetermined pitches in the Y direction and extend in the X direction as its longitudinal direction. These trenches T1 divide the laminated body of the interlayer insulating films 41a' to 41d', the conducting layers 42a' to 42d', and the protecting layer 52' into the stripe-shaped laminated bodies of the interlayer insulating films 41a to 41d, the conducting layers 42a to 42d, and the protecting layer 52' extending in the X direction and disposed at predetermined pitches in the Y direction.

The above-described conventional method forms the state illustrated in FIG. 7, and then performs a process to sequentially embed a variable resistance layer, which will be a memory film, and a conducting layer, which will be the bit line BL, into the trench T1. However, to minimize damage to the variable resistance layer, this embodiment does not form the variable resistance layer at this phase. Instead of this, this embodiment forms the variable resistance layer and the conducting layer in the procedure as follows.

Figure 8:
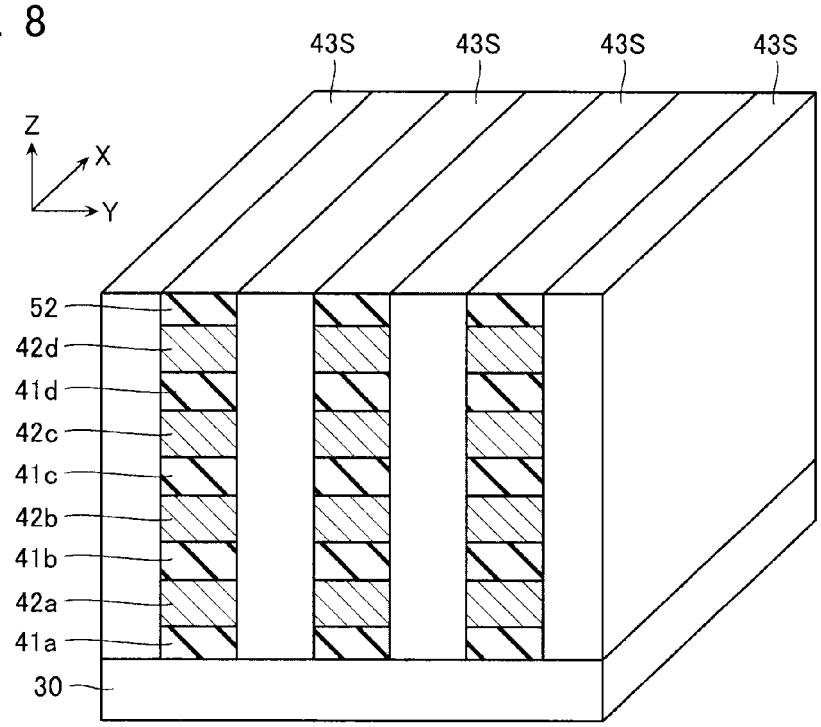

First, as illustrated in FIG. 8, after the process in FIG. 7, semiconductor layers 43S are formed so as to embed the trenches T1. The semiconductor layers 43S are formed so as to embed the stripe-shaped trenches T1. As described later, the semiconductor layer 43S is a sacrificial film removed by etching in a fabrication process. As a result, the semiconductor layer 43S is made of a material whose etching rate is higher compared with the conducting layers 42a to 42d. As one example, in the case where the conducting layers 42a to 42d are made of the material of titanium nitride, the semiconductor layer 43S can be made of the material of polysilicon.

In the case where the conducting layers 42a to 42d are made of the material of polysilicon to which impurities are doped, the semiconductor layer 43S can be made of polysilicon whose content of impurities differs from that of the conducting layers 42a to 42d (for example, non-doped polysilicon not containing impurities). After embedding the semiconductor layers 43S, the semiconductor layers 43S deposited outside the trenches T1 are removed by a CMP method for flattening.

Figure 9:
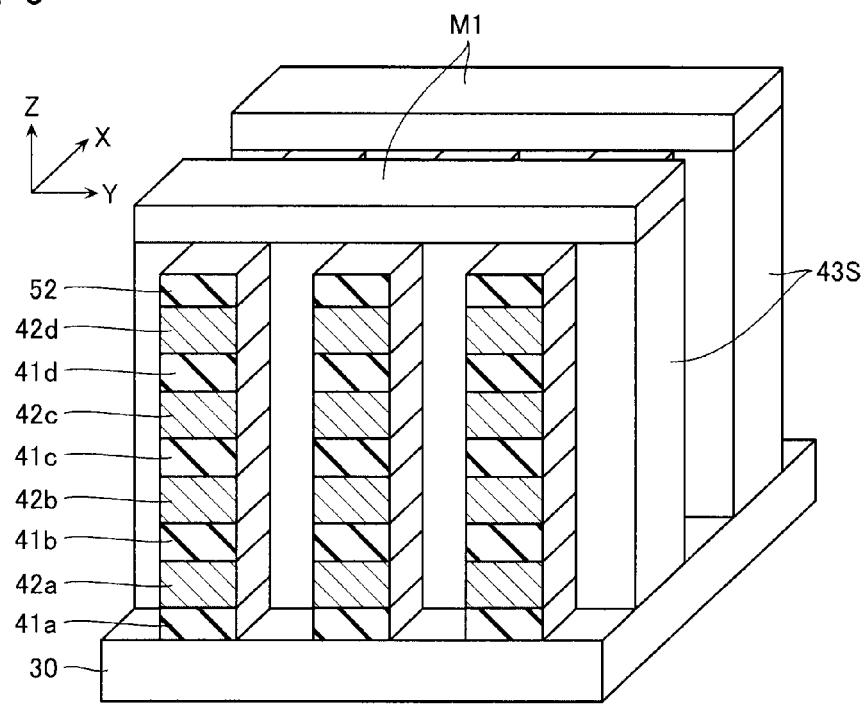

Next, as illustrated in FIG. 9, CMP stopper films M1 having its longitudinal direction in the Y direction are formed at predetermined pitches in the X direction. These CMP stopper films M1 are made of a material of, for example, a silicon nitride film.

Subsequently, using these CMP stopper films M1 as masks, the semiconductor layers 43S at positions not covered with the CMP stopper films M1 are selectively etched by an RIE method. For example, when the semiconductor layers 43S are made of the material of the non-doped polysilicon, the use of etching gas such as CHF3 allows selectively removing the semiconductor layers 43S by etching.

Figure 10:
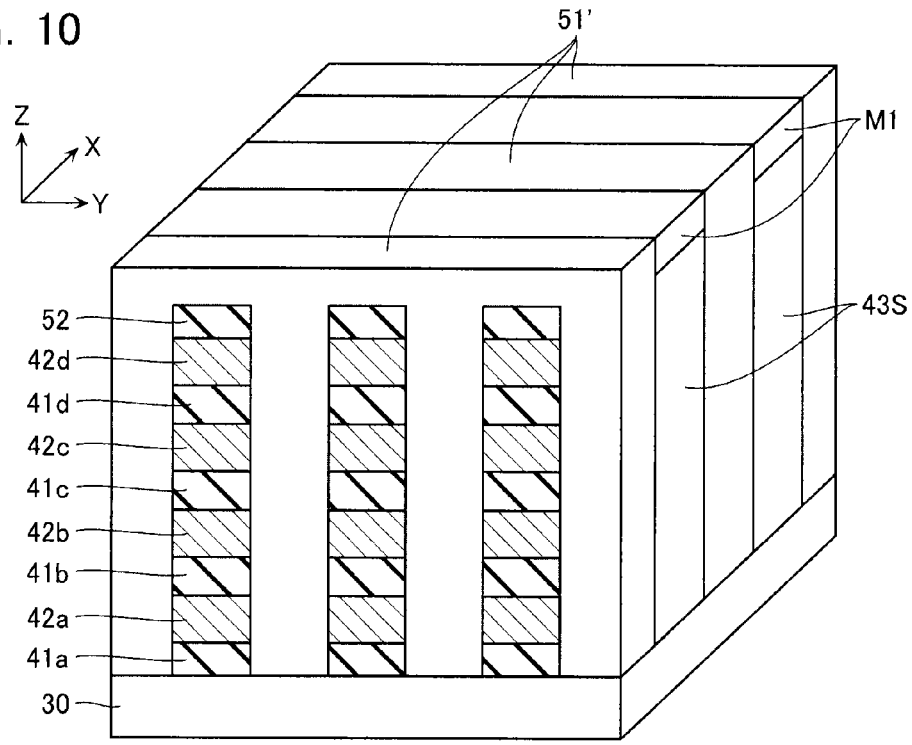
Figure 11:
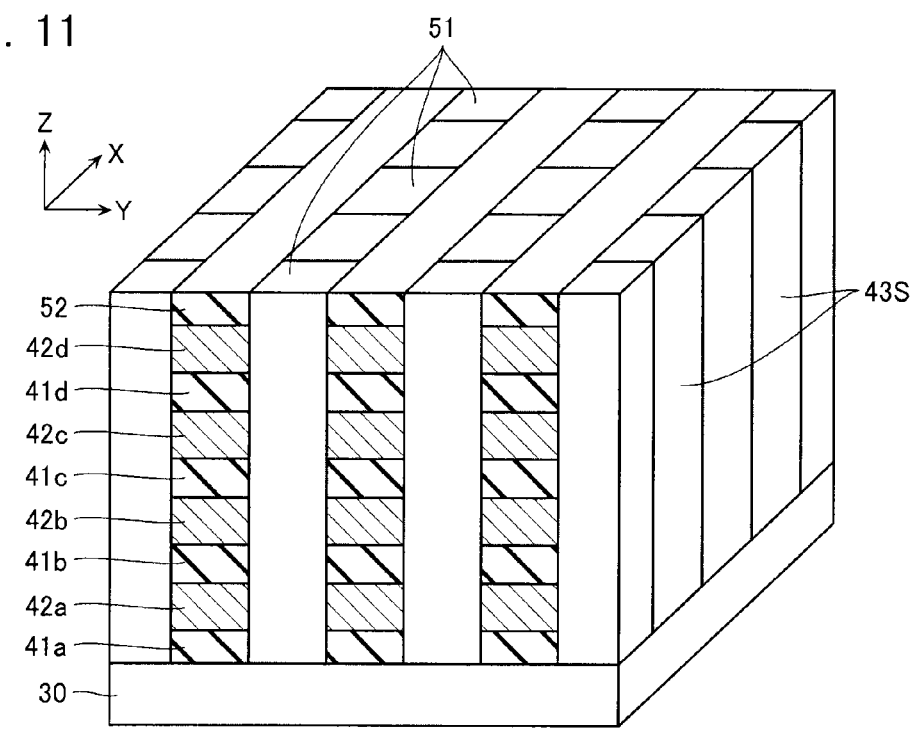
Figure 12:
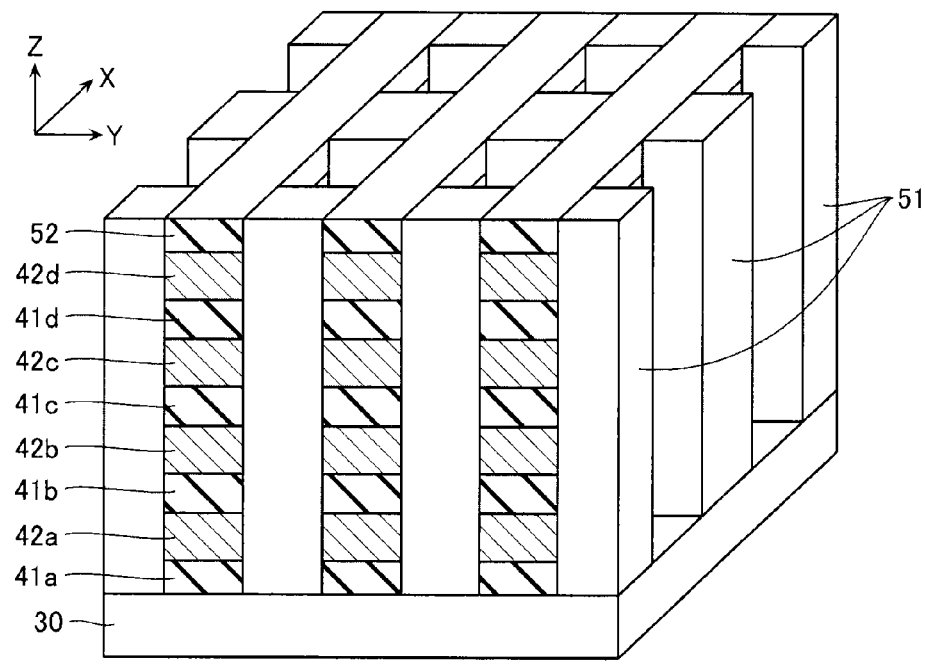

Then, as illustrated in FIG. 10, interlayer insulating films 51' are deposited so as to embed void portions generated by removing the semiconductor layers 43S. Further, as illustrated in FIG. 11, the CMP method is performed to remove CMP stopper films M1' and the interlayer insulating films 51', exposing the surfaces of the semiconductor layers 43S. As illustrated in FIG. 12, wet etching is performed to remove the semiconductor layers 43S.

Figure 13:
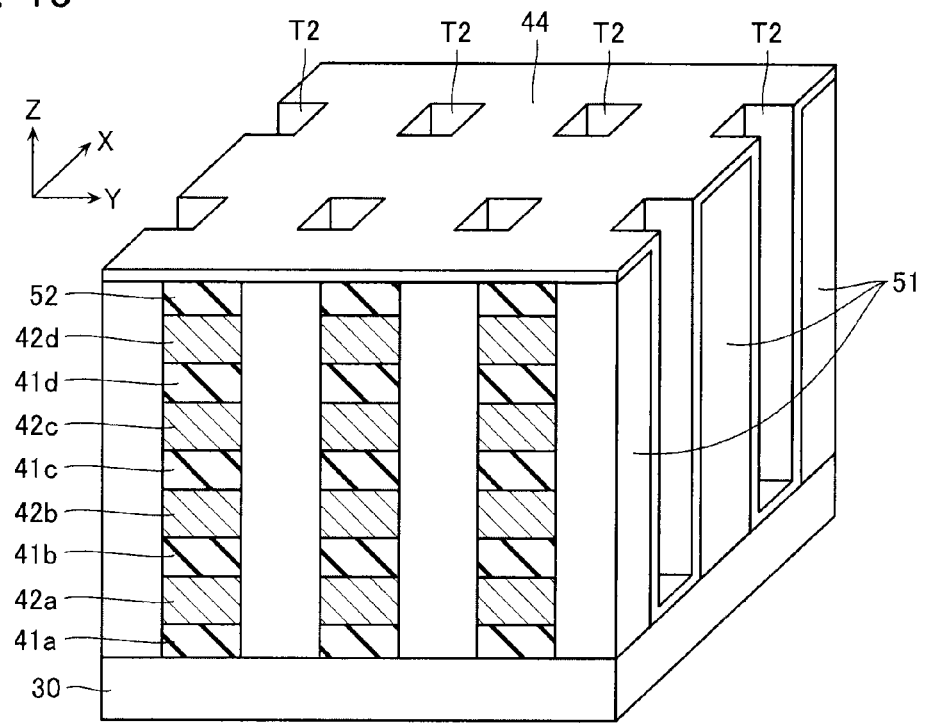

Next, as illustrated in FIG. 13, the variable resistance layers 44 are deposited on the entire memory area (including the part on the surface of the selection transistor layer 30) that includes the inner walls (the lateral faces and the bottom surfaces) of void portions T2, which are generated after the removal of the semiconductor layers 43S, by, for example, an atomic layer deposition (ALD). The variable resistance layer 44 can be made of, for example, the above-described metal oxides as the materials.

Figure 14:
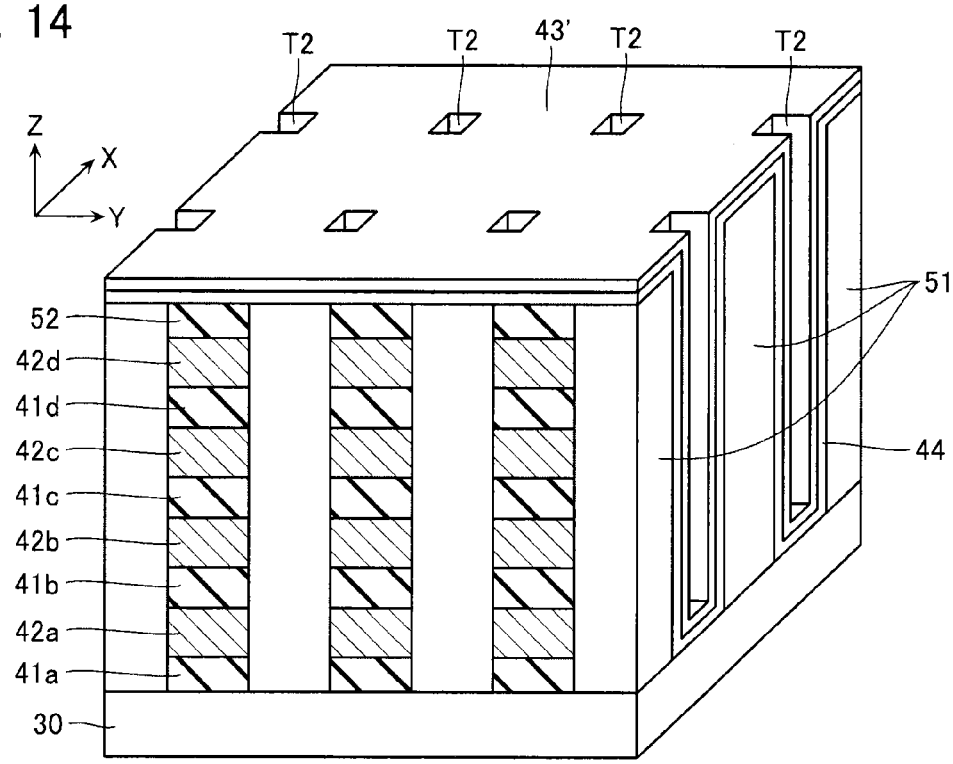

Further, as illustrated in FIG. 14, a polysilicon film 43' with a film thickness of, for example, approximately 5 nm is deposited by the CVD method or a similar method so as to cover the formed variable resistance layers 44. This polysilicon film 43' functions as the process protective film of the variable resistance layers 44.

Figure 15:
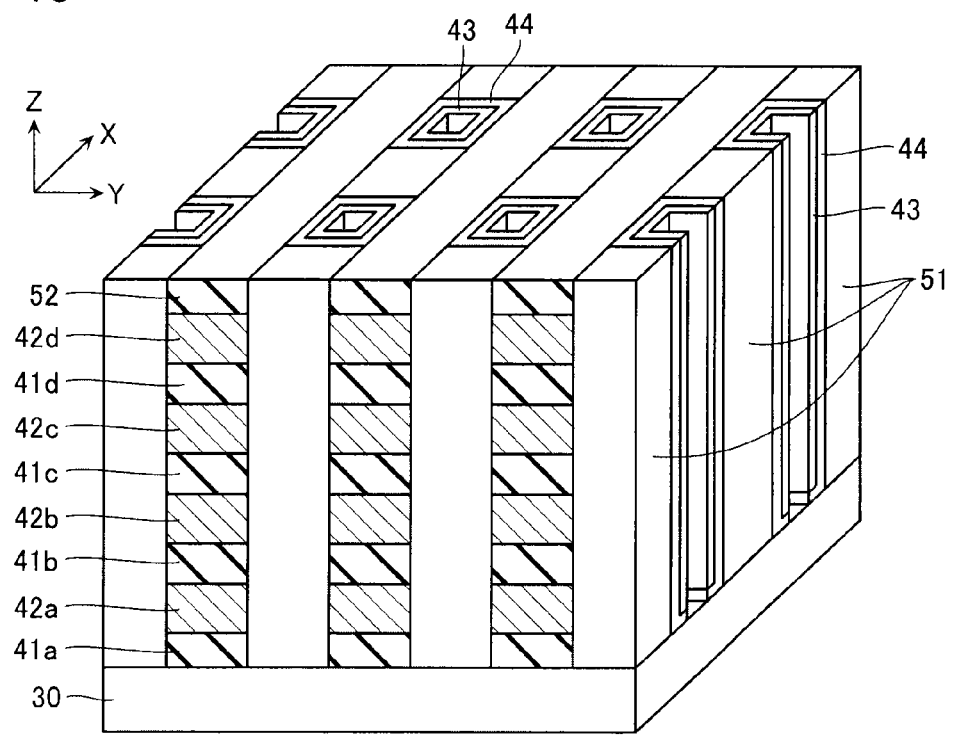
Figure 16:
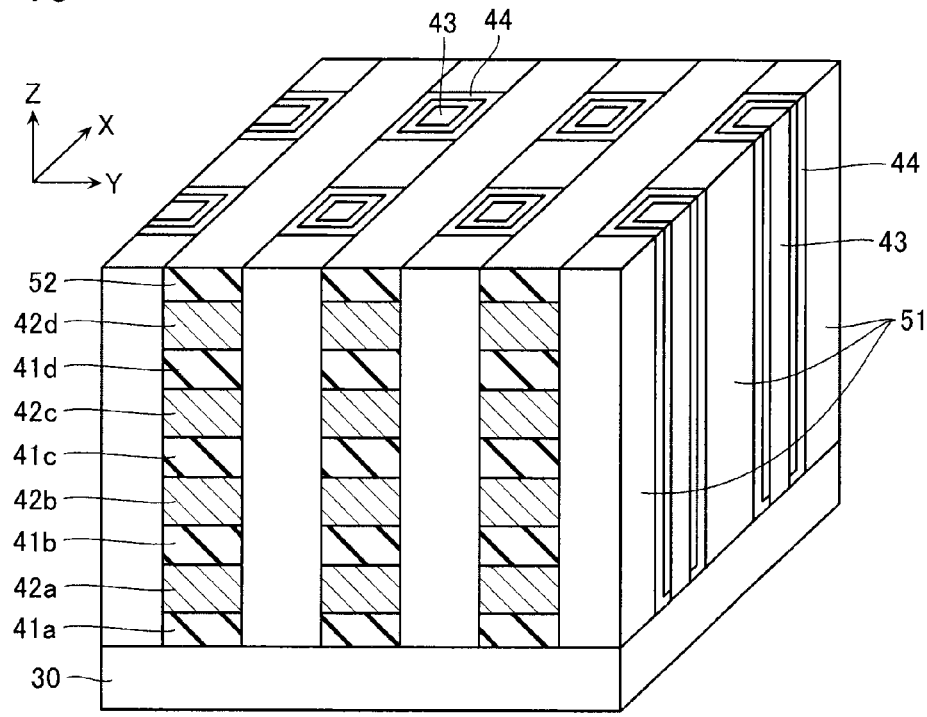

Subsequently, as illustrated in FIG. 15, the variable resistance layers 44 and the polysilicon films 43' deposited on the bottom surfaces of the void portions T2 are removed by an RIE method to expose the surface of the selection transistor layer 30 (specifically, the columnar semiconductor layers 35 of the selection transistor layer 30). This is performed for better electrical connection between the columnar conducting layer 43 and the columnar semiconductor layer 35. However, even if the variable resistance layer 44 remains, as long as the electrical connection between both is properly maintained, the process of FIG. 15 can also be omitted.

Subsequently, the polysilicon film 43' as the process protective film is removed by etching. After that, polysilicon films are embedded into the void portions T2 by the CVD method or a similar method. This forms the above-described columnar conducting layers 43. Afterwards, a contact and a wiring layer are formed by the well-known method, thus completing the structure of the memory cell array 11.

As long as the polysilicon film 43' can be directly used as the columnar conducting layer 43, the process of removing the polysilicon film 43' by etching can also be omitted. That is, the columnar conducting layer 43 is constituted of the polysilicon film 43' and the additional polysilicon film. The additional polysilicon film is deposited to the inner wall of the polysilicon film 43' so as to embed the void portion T2.

According to the manufacturing method described in FIG. 6 to FIG. 16, the variable resistance layer 44 does not receive the process damage by the etching. With the above-described conventional method, the variable resistance layer 44 is formed at the process after the process of FIG. 7. Thereafter, the variable resistance layer 44 is exposed to the etching gas in the etching for embedding the interlayer insulating film, thus receiving the process damage.

However, with the manufacturing method of this embodiment, the variable resistance layers 44 are formed at the entire memory area including the inner walls of the void portions T2 at the process of FIG. 13. After that, the polysilicon films 43' as the process protective films protect the variable resistance layers 44. Afterwards, the etching removal process of the polysilicon film 43' (can be omitted) and the etching removal process of the polysilicon film 43' and the variable resistance layer 44 at the bottom surface of the void portion T2 are only performed. Accordingly, the process damage to the variable resistance layer 44 is reduced to the minimum. Thus, according to the embodiment, the process damage to the variable resistance layer 44 can be minimized, ensuring improving the yield.

When using this manufacturing method, the variable resistance layer 44 is formed so as to cover the lateral faces of the columnar conducting layer 43 over the whole circumference. Meanwhile, the variable resistance layers 44 are not formed at the positions sandwiched between the interlayer insulating films 51 and the conducting layers 42a to 42d.

Second Embodiment

Figure 17:
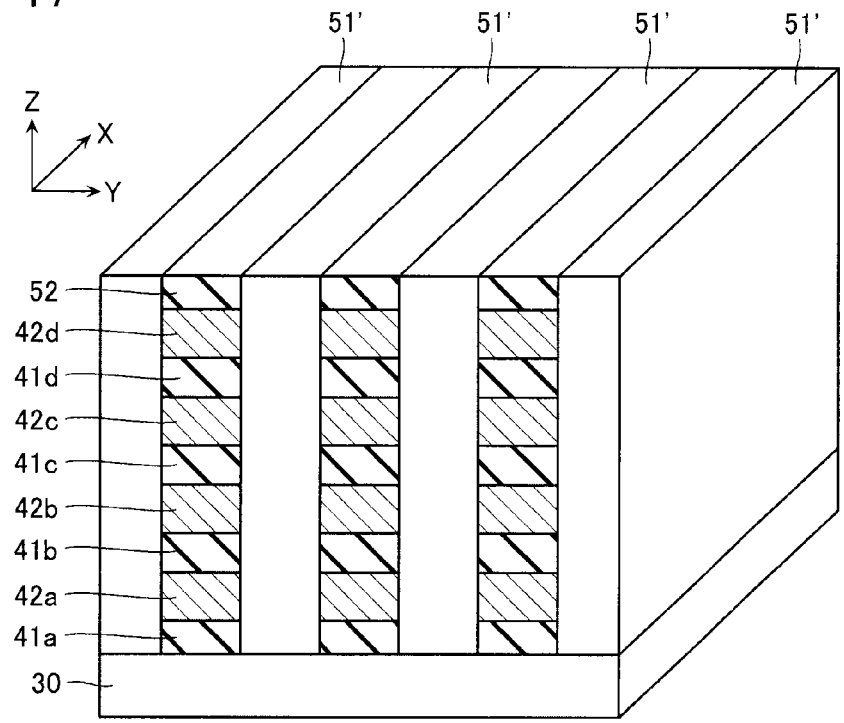
FIG. 17 and FIG. 18 are exemplary perspective views illustrating a method of manufacturing the memory cell array 11 according to a second embodiment
Figure 18:
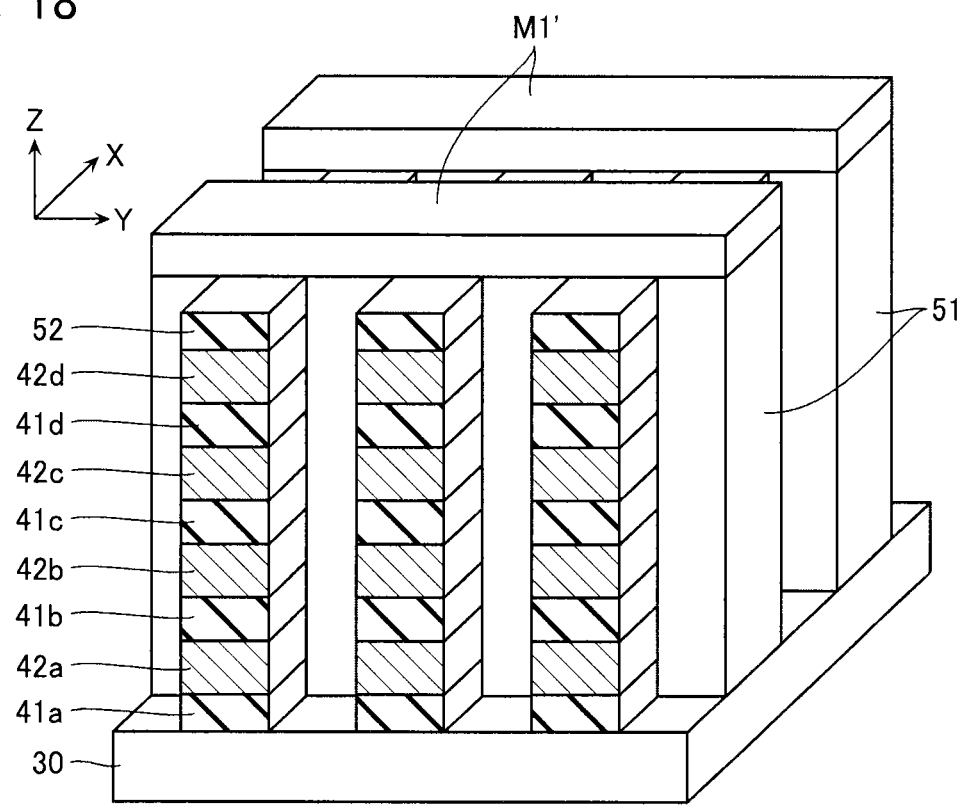

The following describes a semiconductor memory device according to the second embodiment with reference to FIG. 17 and FIG. 18. The structure of the semiconductor memory device of this second embodiment is similar to that of the first embodiment; therefore, the description is omitted. However, the semiconductor memory device of this second embodiment differs from the first embodiment in the manufacturing method.

The following describes the method of manufacturing the semiconductor memory device of the second embodiment with reference to FIG. 17 and FIG. 18. First, the processes described in FIG. 6 and FIG. 7 are performed to obtain the structure of FIG. 7. Next, as illustrated in FIG. 17, the interlayer insulating films 51' are embedded into the trenches T1 with the structure of FIG. 7 by the CVD method or a similar method. In this respect, the second embodiment differs from the first embodiment, which embeds the semiconductor layers 43S that will be the sacrificial films into the trenches T1. The embedded interlayer insulating films 51' are flattened by the CMP method so as to match the top surfaces of interlayer insulating films 52.

Next, as illustrated in FIG. 18, the CMP stopper films M1' having its longitudinal direction in the Y direction are formed at predetermined pitches in the X direction. These CMP stopper films M1 are made of a material of, for example, a silicon nitride film. Using these CMP stopper films M1' as masks, the interlayer insulating films 51' at positions not covered with the CMP stopper films M1' are selectively etched by the RIE method. This obtains the structure approximately identical to the structure of FIG. 12 of the first embodiment.

Although the illustration is omitted, thereafter, the execution of the processes illustrated in FIG. 13 to FIG. 16 obtains the structure identical to the structure of the first embodiment.

By the manufacturing method of the second embodiment as well, the variable resistance layers 44 are formed at the entire memory area including the inner walls of the void portions T2. After that, the polysilicon films 43' as the process protective films protect the variable resistance layers 44. Thus, according to the second embodiment as well, the process damage to the variable resistance layer 44 can be minimized, ensuring improving the yield similar to the first embodiment.

This manufacturing method of the second embodiment eliminates the need for forming the sacrificial film. This allows reducing a count of processes compared with the first embodiment.

Third Embodiment

Figure 19:
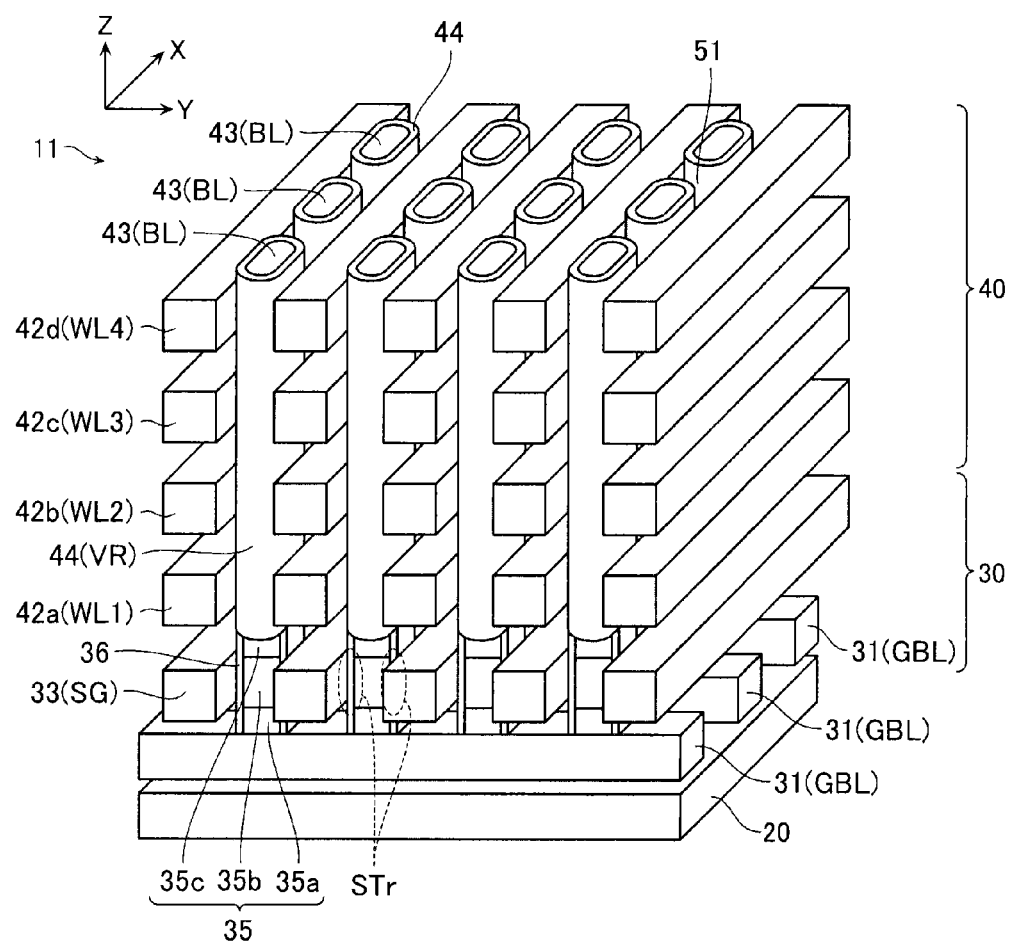
FIG. 19 is an exemplary perspective view illustrating a laminated structure of the memory cell array 11 according to a third embodiment.

The following describes a semiconductor memory device according to the third embodiment with reference to FIG. 19. The basic structure of this third embodiment is similar to the above-described embodiment (FIG. 1 and FIG. 2). However, this third embodiment differs from the above-described embodiments in the shapes of the columnar conducting layer 43 (the bit line BL) and the variable resistance layer 44.

FIG. 19 is a schematic perspective view of the semiconductor memory device according to the third embodiment and corresponds to FIG. 3. Like reference numerals designate identical configurations to FIG. 3, and therefore such configurations will not be further elaborated or will be briefly described here.

With the semiconductor memory device of this third embodiment, the columnar conducting layer 43 is formed into an oval shape, an elliptical shape, or a similar shape having its longitudinal direction in the X direction. Thus, at least a part of the shape of the cross section in the direction intersecting with at least the Z direction is formed into the approximately arc shape. The outline of the variable resistance layer 44 is similarly formed into the oval shape or the elliptical shape so as to cover the peripheral area of the columnar conducting layer 43. For example, instead of the masks M1, which are illustrated in FIG. 18, such shape can be formed by using the mask having the oval-shaped or the elliptical-shaped opening.

This third embodiment can also provide the effect similar to the above-described embodiments.

Fourth Embodiment

The following describes a semiconductor memory device according to the fourth embodiment with reference to FIG. 20 to FIG. 23. The semiconductor memory device of this fourth embodiment differs from the above-described embodiments in the specific structure of the memory cell array 11. The equivalent circuit of the memory cell array 11 is similar to the above-described embodiments.

Figure 20:
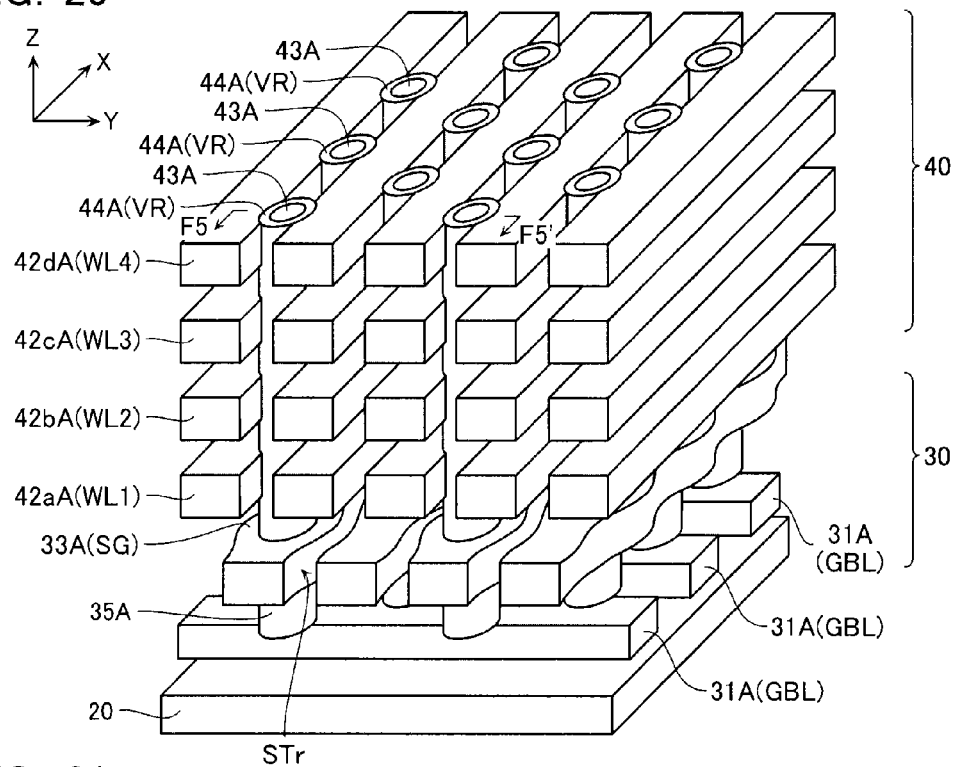
FIG. 20 is a schematic perspective view of a semiconductor memory device according to a fourth embodiment.
Figure 21:
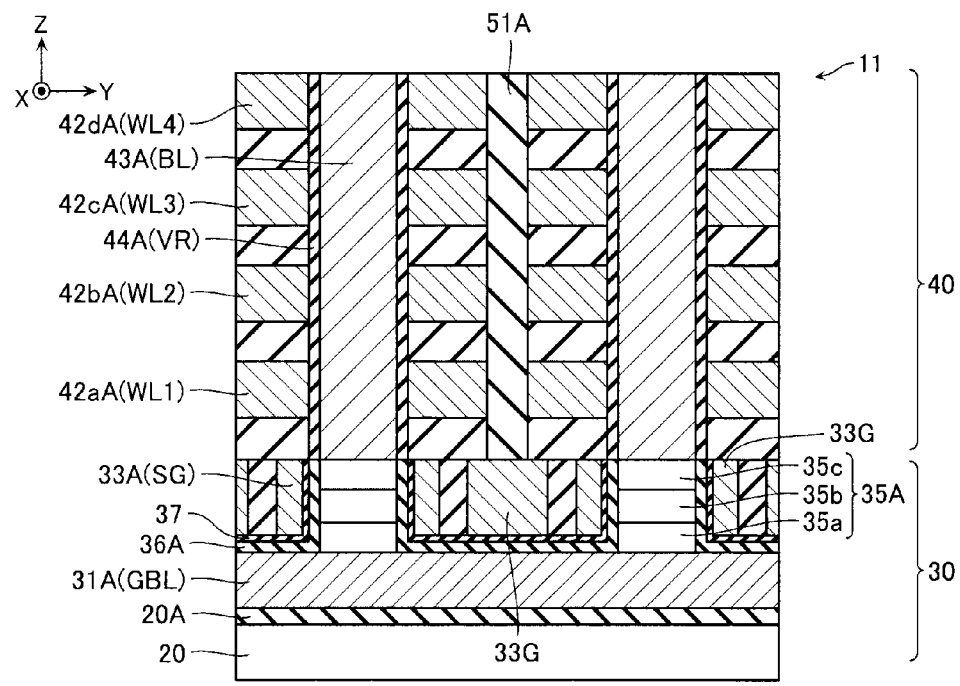
FIG. 21 is a schematic cross-sectional view taken along F5-F5' of FIG. 20.
Figure 22:
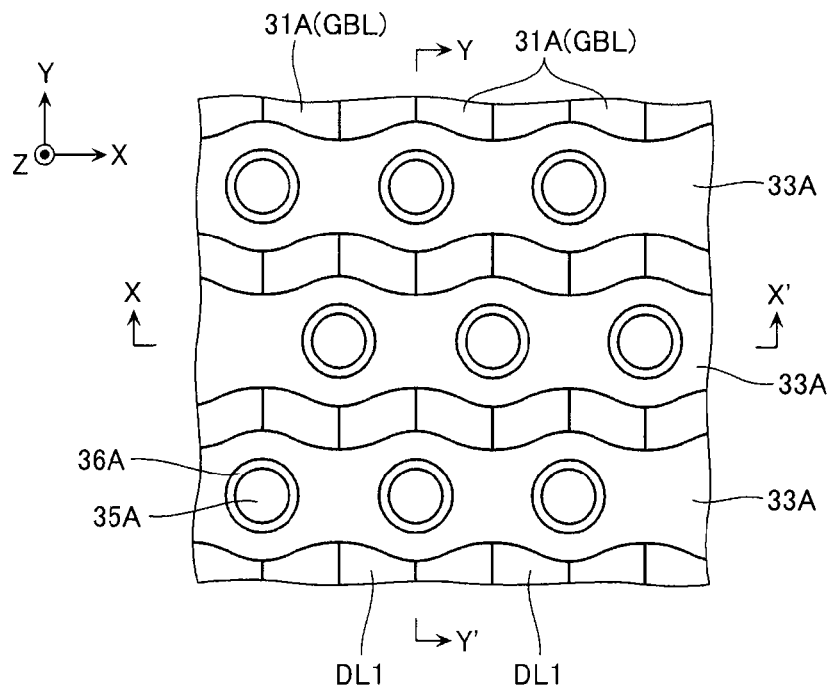
FIG. 22 is a cross-sectional view taken along an X-Y plane of a selection transistor layer 30.
Figure 23:
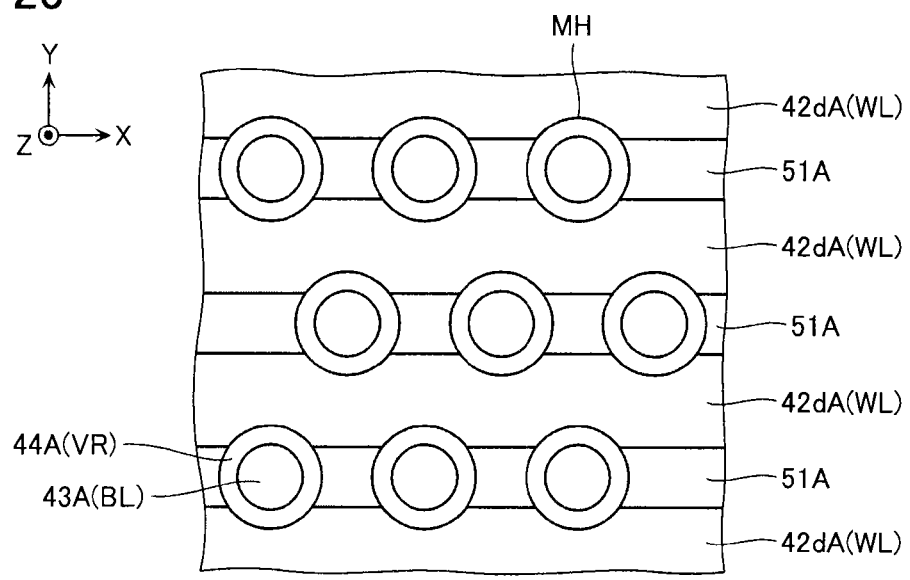
FIG. 23 is a cross-sectional view taken along an X-Y plane of a part of a memory layer 40.

FIG. 20 is a schematic perspective view of the semiconductor memory device according to the fourth embodiment. FIG. 21 is a schematic cross-sectional view taken along F5-F5' of FIG. 20. FIG. 22 is a cross-sectional view taken along the X-Y plane of the selection transistor layer 30. FIG. 23 is a cross-sectional view taken along the X-Y plane of the part of the memory layer 40. FIG. 20 omits the illustration of the interlayer insulating films.

As illustrated in FIG. 20 and FIG. 21, the memory cell array of this fourth embodiment includes the selection transistor layer 30 and the memory layer 40, which are laminated on the substrate 20, similar to the above-described embodiments.

As details are illustrated in FIG. 21, the selection transistor layer 30 includes conducting layers 31A, gate insulating films 36A, barrier metal films 37, and conducting layers 33A. These conducting layers 31A, gate insulating films 36A, barrier metal films 37, and conducting layer 33A are laminated in the Z direction vertical to the substrate 20. The gate insulating films 36A and the barrier metal films 37 are also disposed along side surfaces of columnar semiconductor layers 35A, which will be described later.

The conducting layer 31A functions as a global bit line GBL similar to the conducting layer 31 of the first embodiment. The conducting layers 33A function as the selection gate line SG and a gate of the selection transistor STr similar to the conducting layer 33 of the first embodiment. The conducting layers 31A are arranged in the X direction, which is parallel to the substrate 20, at predetermined pitches and extend in the Y direction as its longitudinal direction. The conducting layers 33A are arranged at predetermined pitches in the Y direction and extend in the X direction as its longitudinal direction.

As illustrated in FIG. 20 and FIG. 21, the selection transistor layer 30 includes the columnar semiconductor layers 35A and gate insulating layers 36A. The structure and materials of the columnar semiconductor layer 35A may be approximately identical to the columnar semiconductor layer 35 of the first embodiment. The columnar semiconductor layer 35A functions as the body (the channel) of the selection transistor STr. The gate insulating layer 36A functions as a gate insulating film of the selection transistor STr. The gate insulating layer 36A is disposed so as to cover the peripheral area of the columnar semiconductor layer 35A, and also is disposed at a position between the surface of the conducting layer 31A and the conducting layer 33A. This electrically insulates and separates the conducting layer 31A from the conducting layer 33A.

As illustrated in FIG. 22, the one columnar semiconductor layer 35A is disposed passing through the one conducting layer 33A together with the gate insulating layer 36A, which is disposed around the columnar semiconductor layer 35A. That is, with the first embodiment, the two conducting layers 33 sandwich the one columnar semiconductor layer 35 from both sides. Meanwhile, with this fourth embodiment, the columnar semiconductor layer 35A passes through the part close to the centers of the conducting layers 33A. The conducting layer 33A surrounds the columnar semiconductor layers 35A over the whole circumference. In the example illustrated in the drawing, the conducting layer 33A does not have a rectangular shape on the X-Y plane. The conducting layer 33A has a wide width shape at positions through which the columnar semiconductor layers 35A pass, and has a narrow width shape at parts other than the positions. In other words, the side surface of the conducting layer 33A in the Y direction has a wave shape. The side surface has a convex shape at positions through which the columnar semiconductor layers 35A pass and has a wide line width. The conducting layers 33A adjacent to one another are disposed such that the wave-shaped concave portions and convex portions mesh with one another. This reduces wiring pitches.

As illustrated in FIG. 22, the columnar semiconductor layers 35A are disposed in a staggered pattern on the X-Y plane where the positions of the adjacent columnar semiconductor layers 35A are displaced by half pitches in the Y direction. In other words, the plurality of columnar semiconductor layers 35A adjacent in the Y direction are disposed at different positions from one another in the X direction. This differs from the above-described embodiments where the columnar semiconductor layers 35 are disposed in a matrix in the X-Y direction.

FIG. 20 and FIG. 21 illustrate the example of disposing the selection transistor layer 30 under the memory layer 40. However, in the case where the global bit lines GBL are disposed above the columnar conducting layers 43, the selection transistor layer 30 may be disposed above the memory layer 40. That is, the selection transistors STr may be connected between the global bit lines GBL, which are disposed above the memory layer 40, and the upper ends of the columnar conducting layers 43.

As illustrated in FIG. 20 and FIG. 21, the memory layer includes interlayer insulating films 41aA to 41dA and conducting layers 42aA to 42dA laminated in alternation in the Z direction. The conducting layers 42aA to 42dA function as the respective word lines WL1 to WL4 similar to the conducting layers 42a to 42d of the first embodiment. The materials of the conducting layers 42aA to 42dA may be identical to the conducting layers 42a to 42d of the first embodiment. However, these conducting layers 42aA to 42dA are formed wider than the conducting layers 42a to 42d. This decreases the disposition pitches in the Y direction. At a position between the conducting layers 42aA to 42dA, an interlayer insulating film 51A to insulate and separate the conducting layers 42aA to 42dA are embedded in the Y direction. However, memory holes MH into which columnar conducting layers 43A and variable resistance layers 44A are to be embedded are formed cutting a part of the conducting layers 42aA to 42dA. In other words, the columnar conducting layers 43A and the variable resistance layers 44A, which cover the peripheral areas of the columnar conducting layers 43A, are disposed at positions separating the interlayer insulating film 51A in the X direction. In view of this, the width of the interlayer insulating film 51A in the Y direction (namely, line space width of the conducting layers 42aA to 42dA in the Y direction) is configured to be smaller than the width of the interlayer insulating film 51 of the first embodiment in the Y direction. By the amount, the widths of the conducting layers 42aA to 42dA in the Y direction are configured to be large.

As illustrated in FIG. 20 and FIG. 21, the memory layer 40 includes the columnar conducting layers 43A and the variable resistance layers 44A. The columnar conducting layer 43A functions as the bit line BL similar to the columnar conducting layer 43 of the first embodiment. The variable resistance layer 44A functions as the variable resistive element VR similar to the variable resistance layer 44 of the first embodiment.

As described above, the columnar semiconductor layers 35A of the selection transistor layer 30 are disposed in the staggered pattern in the X-Y plane. In view of this, the columnar conducting layers 43A of the memory layer 40 are also disposed in a houndstooth check pattern so as to match the columnar semiconductor layers 35A. In other words, the plurality of columnar conducting layers 43A adjacent in the Y direction are disposed at different positions from one another in the X direction. Lower ends of the columnar conducting layers 43A are in contact with top surfaces of the columnar semiconductor layers 35A and extend in a columnar manner in the Z direction. In the example illustrated in the drawing, the columnar conducting layer 43A has the columnar shape; however, the shape of the columnar conducting layer 43A is not limited to this. The columnar conducting layer 43A may have the rectangular shape similar to the columnar conducting layer 43 of the first embodiment or may partially have an arc shape (such as an elliptical and an oval shape) similar to the third embodiment.

Similar to the variable resistance layer 44 of the first embodiment, the variable resistance layer 44A is formed into a closed loop shape over the whole circumference of the columnar conducting layer 43A. However, the variable resistance layer 44A is at least partially removed at a position between the bottom surface of the columnar conducting layer 43A and the columnar semiconductor layer 35A. Accordingly, the columnar conducting layer 43A and the columnar semiconductor layer 35A have a part at which the columnar conducting layer 43A and the columnar semiconductor layer 35A are directly connected without the variable resistance layer 44A therebetween. The columnar conducting layer 43A is made of a conductive material such as polysilicon, tungsten nitride (WN), tungsten (W), and ruthenium (Ru); or a laminated body of a plurality of kinds of these materials. The variable resistance layer 44A can made of, for example, metal oxide (for example, $HfO_X$, $Al_2O_X$, $TiO_X$, $ZrO$, $AlO$, $SiOx$, $NiO_X$, $WO_X$, and $Ta_2O_X$) and the laminated body of these materials.

As illustrated in FIG. 23, the conducting layers 42aA to 42dA have a line width wider than the conducting layers 42a to 42d of the first embodiment in the Y direction. The width of the interlayer insulating film 51A between the conducting layers 42dA (or 42aA, 42bA, or 42cA) adjacent in the Y direction is configured smaller than the width of the memory hole MH in the Y direction (that is, the width of the outer shape of the variable resistance layer 44A in the Y direction). The wide line width of the conducting layers 42aA to 42dA ensures decreasing a wiring resistance of the word line WL compared with that of the first embodiment.

While the line width of the conducting layers 42aA to 42dA in the Y direction is configured to be the same extent to the first embodiment, when the width of the interlayer insulating film 51A in the Y direction is configured smaller than that of the first embodiment and the memory hole MH is formed larger than the width of the interlayer insulating film 51A in the Y direction so as to separate the interlayer insulating film 51A in the X direction, a clearance of the memory hole MH in the Y direction is configured to be small. This ensures decreasing the size of the memory cell array and enhancing an integration degree of the memory cell.

The columnar conducting layers 43A are embedded in the memory holes MH via the variable resistance layers 44A. The memory holes MH are formed passing through the interlayer insulating films 51A which are positioned between the adjacent conducting layers 42aA to 42dA, and a part of the conducting layers 42aA to 42dA. That is, the memory holes MH are formed so as to dig down a part of the side surfaces of the two adjacent conducting layers 42aA to 42dA.

Figure 24:
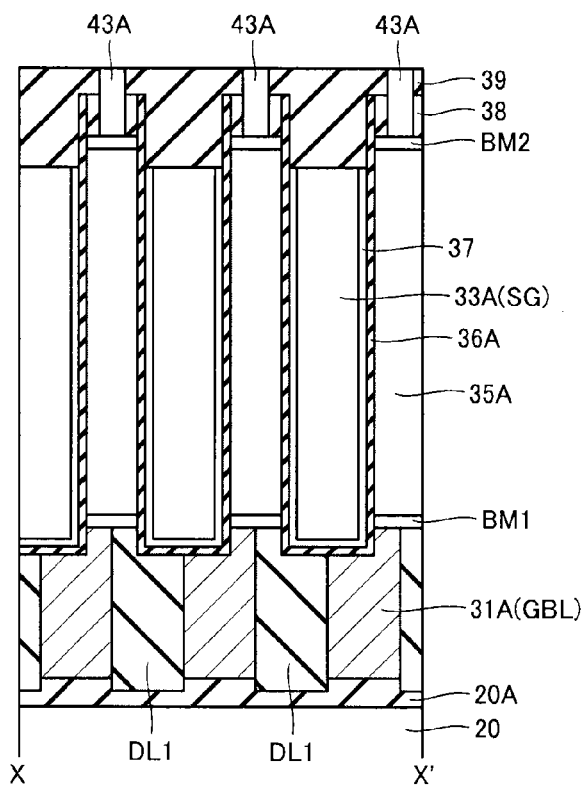
FIG. 24 and FIG. 25 are cross-sectional views illustrating details of a configuration of the selection transistor layer 30.
Figure 25:
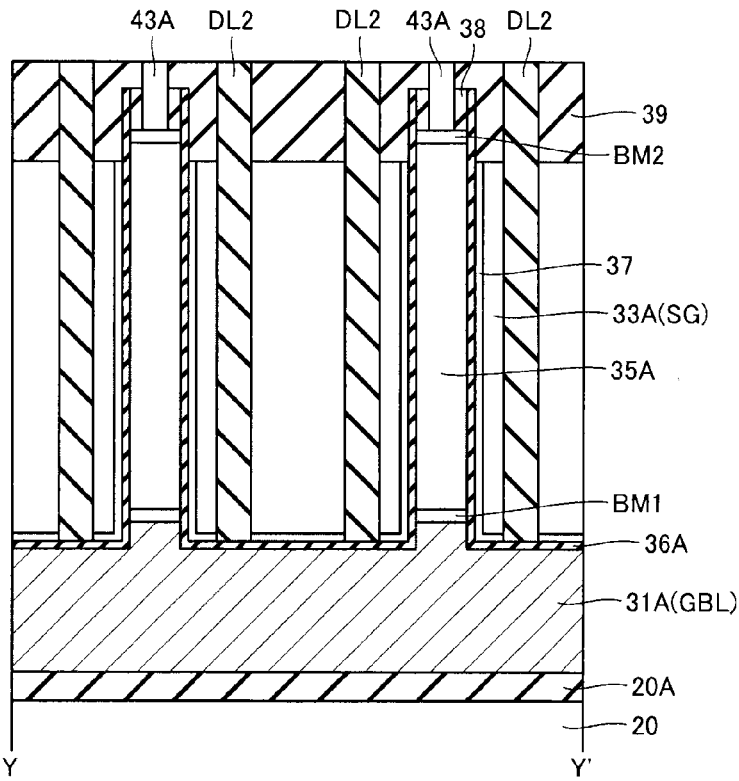

FIG. 24 and FIG. 25 illustrate detailed cross-sectional views of the selection transistor layer 30. FIG. 24 is a cross-sectional view taken along X-X' of FIG. 22. FIG. 25 is a cross-sectional view taken along Y-Y' of FIG. 22.

As illustrated in FIG. 24, conducting layers 31A are formed in the Y direction as its longitudinal direction. Isolation insulating films DL1 are embedded between the adjacent conducting layers 31A. In the example illustrated in the drawing, a position of the surface of the conducting layer 31A in the Z direction matches a position of a surface of the isolation insulating film DL1 in the Z direction; however, both may be different.

On the surfaces of the conducting layers 31A and the isolation insulating films DL1, barrier metal films BM1 are deposited. The conducting layer 31A is in contact with a lower end of the columnar semiconductor layer 35A via this barrier metal film BM1. As illustrated in FIG. 24, the center of the lower end of the columnar semiconductor layer 35A is formed at a position displaced by half pitch with respect to the center of the conducting layer 31A in the X direction. In this cross-sectional view, the columnar semiconductor layers 35A are each formed at positions displaced by the half pitches to the right with respect to the conducting layers 31A (the global bit lines GBL). The columnar semiconductor layers 35A are disposed in the houndstooth check pattern on the X-Y plane. Therefore, although the illustration is omitted, the columnar semiconductor layers 35A adjacent in the depth direction perpendicular to the paper of FIG. 24 are formed at positions displaced by half pitches to the left with respect to the conducting layers 31A, which are opposite positions from FIG. 24. Thus, the columnar semiconductor layers 35A and the conducting layers 31A are configured to be displaced by half pitches. This allows the columnar semiconductor layers 35A, which are disposed in the houndstooth check pattern, to be connected to the conducting layers 31A, which are disposed in a line-and-space pattern.

On the side surface of the columnar semiconductor layer 35A, a conducting layer 33A is disposed sandwiching a gate insulating film 36A and the barrier metal film 37. The gate insulating film 36A and the barrier metal film 37 are disposed along the bottom surfaces of the conducting layer 33A as well as the side surface of the conducting layer 33A. This electrically separates the conducting layer 33A and the conducting layer 31A. In the example illustrated in the drawing, the lower surface of the conducting layer 33A is positioned lower than the position of the lower surface of the columnar semiconductor layer 35A; however, this is merely an example. The positions of both in the Z direction may be identical, or inversely, the position of the lower surface of the conducting layer 33A may be positioned upper than the position of the lower surface of the columnar semiconductor layer 35A.

On the top surface of the columnar semiconductor layer 35A, a barrier metal film BM2, a stopper film 38, and an isolation insulating film 39 are deposited in this order from the lower. The stopper film 38 and the isolation insulating film 39, for example, can be made of a silicon nitride film (SiN). The columnar conducting layer 43A passes through the stopper film 38 and the isolation insulating film 39 and then is in contact with the upper end of the columnar semiconductor layer 35A.

Manufacturing Method

Next, the following describes the method of manufacturing the selection transistor layer 30 of this fourth embodiment with reference to FIG. 26A to FIG. 31B. FIG. 26A to FIG. 31A illustrate respective processes of the manufacturing method with the cross sections taken along the X-X' direction in FIG. 22. FIG. 26B to FIG. 31B illustrate respective processes of the manufacturing method with the cross sections taken along the Y-Y' direction in FIG. 22.

Figure 26A:
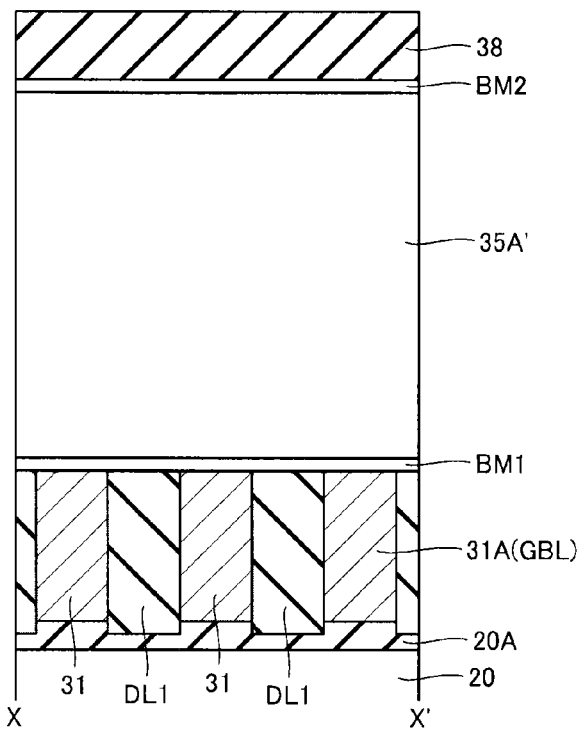
FIG. 26A to FIG. 31B are schematic perspective views of the semiconductor memory device according to the fourth embodiment.
Figure 26B:
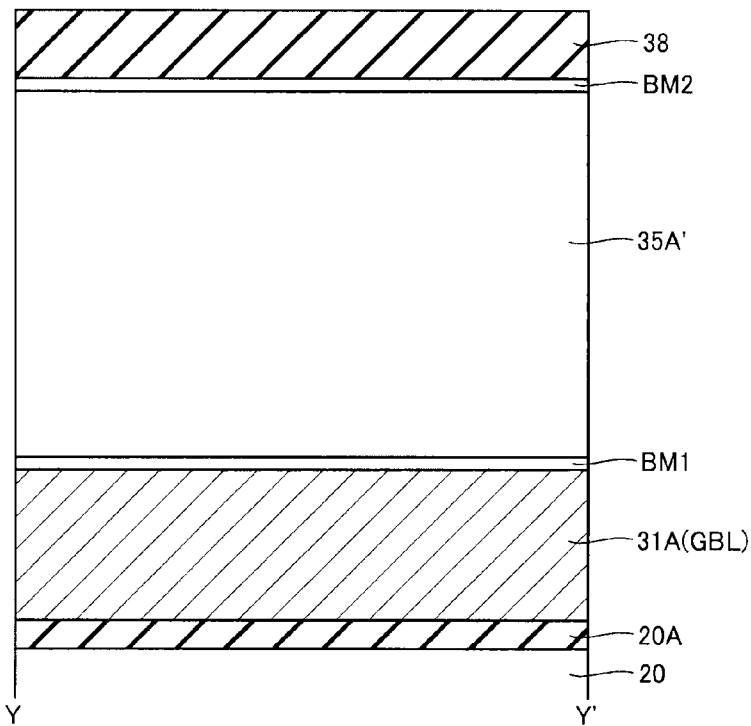

First, as illustrated in FIG. 26A and FIG. 26B, on the entire surface of the surface of the substrate 20, a conductive film (for example, polysilicon), which becomes the material of the conducting layer 31A, is deposited via the interlayer insulating film 20A. After that, trenches are formed in the Y direction as its longitudinal direction to separate the conductive film, thus forming the conducting layers 31A. Afterwards, insulating films made of, for example, silicon oxide are embedded to the trenches to form the isolation insulating films DL1. Afterwards, a flattening process is performed. Subsequently, on the surfaces of the conducting layers 31A and the isolation insulating films DL1, a barrier metal film BM1, a semiconductor layer 35A', a barrier metal film BM1, and the stopper film 38 are deposited in this order from the lower.

Figure 27A:
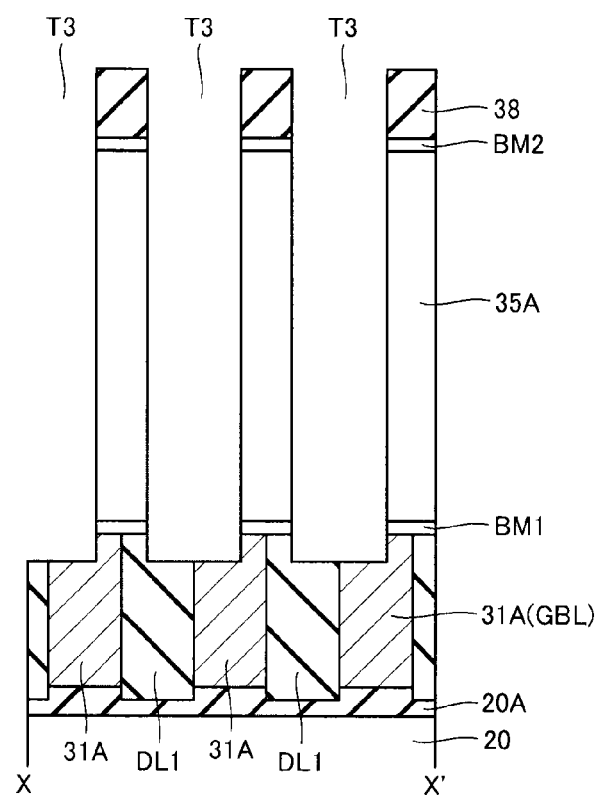
Figure 27B:
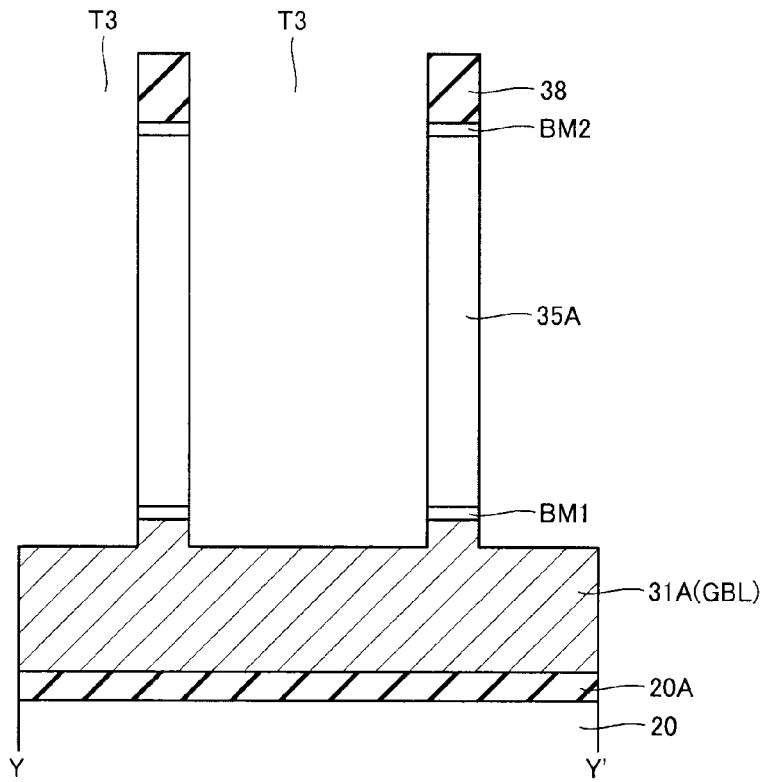

Thereafter, as illustrated in FIG. 27A and FIG. 27B, resists (not illustrated) are deposited on the surfaces of the stopper films 38. By photolithography and etching using these resists as masks, trenches T3 are formed. The trench T3 passes through the stopper film 38, the barrier metal film BM2, the semiconductor layer 35A', and the barrier metal film BM1, and finally reaches the conducting layer 31A. The semiconductor layers 35A' left after the etching will be the above-described columnar semiconductor layers 35A. The columnar semiconductor layers 35A are arrayed in the houndstooth check pattern on the substrate 20. The lower ends of the columnar semiconductor layers 35A are in contact with the conducting layer 31A displaced by half pitches in the X direction.

Figure 28A:
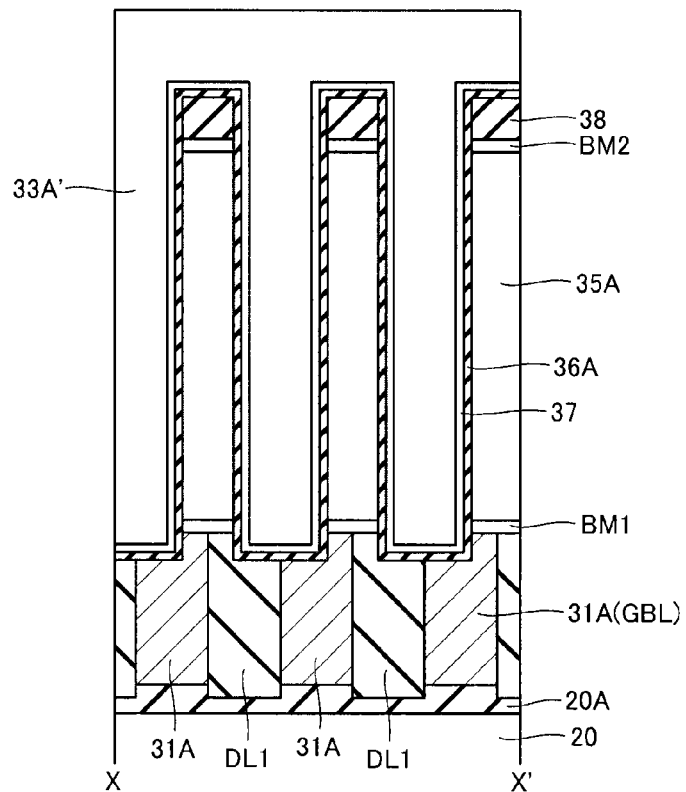
Figure 28B:
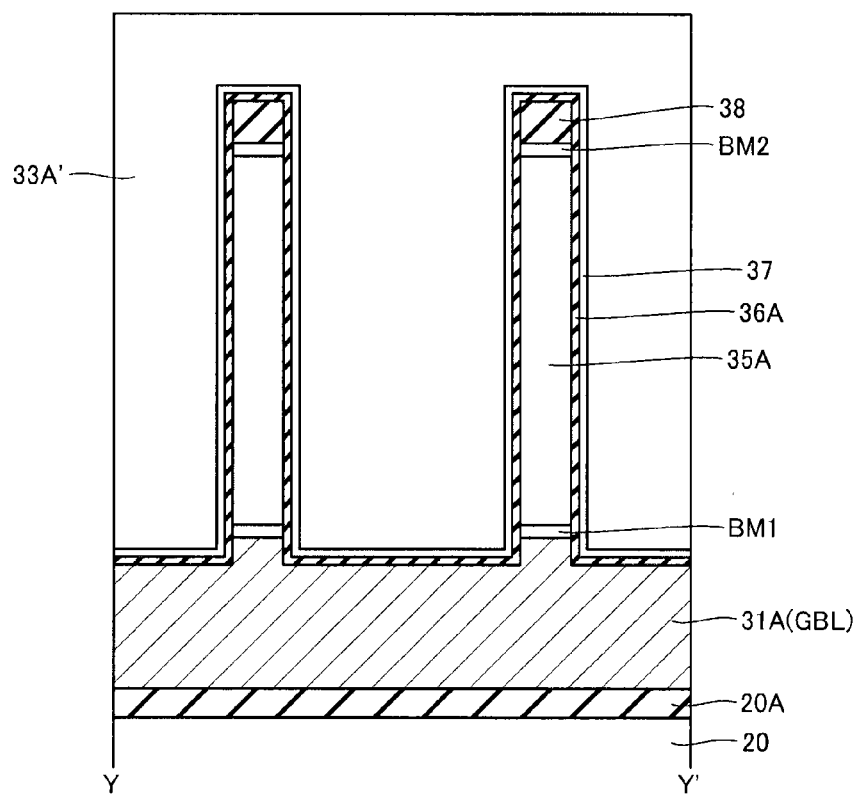

Next, as illustrated in FIG. 28A and FIG. 28B, the gate insulating film 36A and a barrier metal film 37 are deposited along the inner wall of the trench T3 by a CVD method or a similar method. The CVD method is additionally performed to deposit the conducting layer 33A made of, for example, polysilicon so as to embed the trenches T3.

Figure 29A:
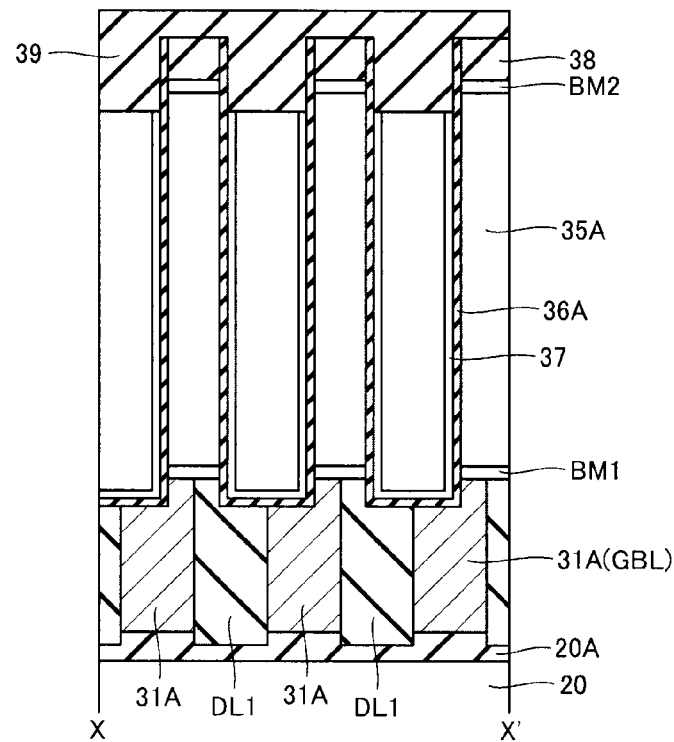
Figure 29B:
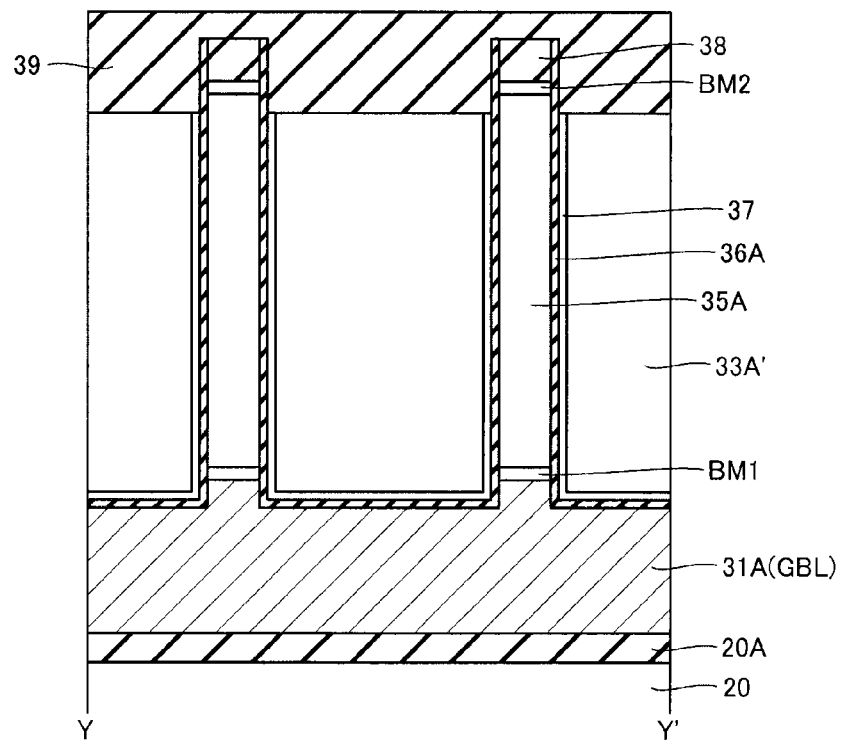

Then, as illustrated in FIG. 29A and FIG. 29B, wet etching is performed to retreat the surface of a conducting layer 33A' up to the lower side of the barrier metal film BM2. After that, the isolation insulating film 39 is deposited in a position including a void formed at the retreated positions. After the isolation insulating film 39 is deposited, the surface of the isolation insulating film 39 is flattened by the CMP method.

Figure 30A:
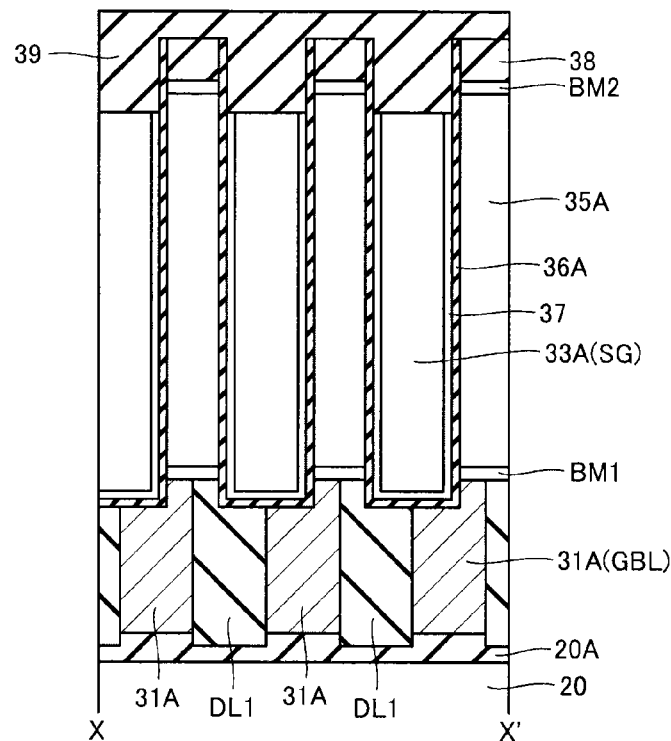
Figure 30B:
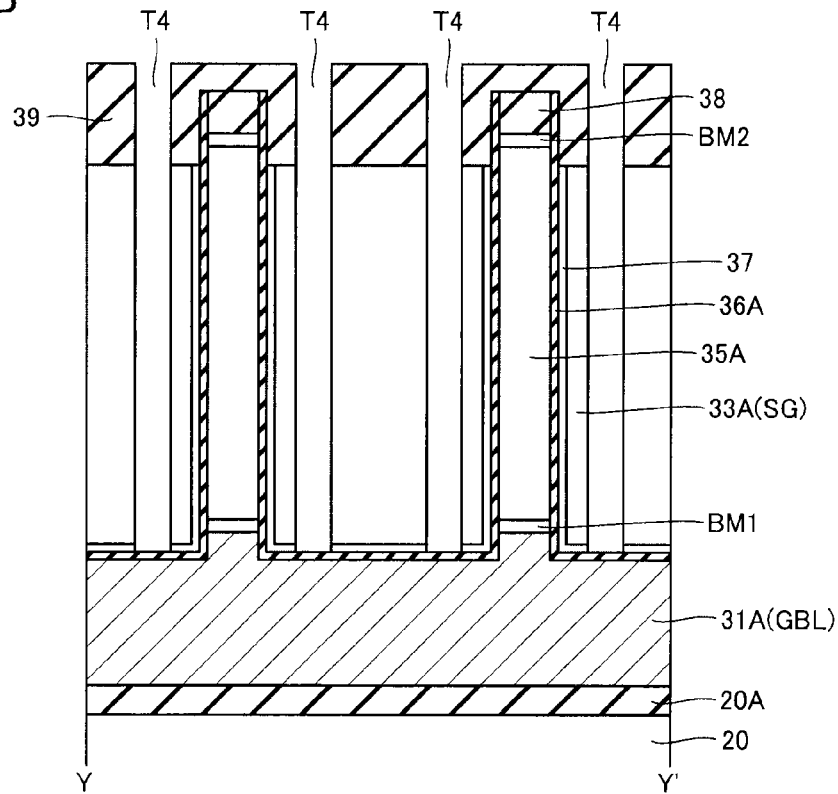
Figure 31A:
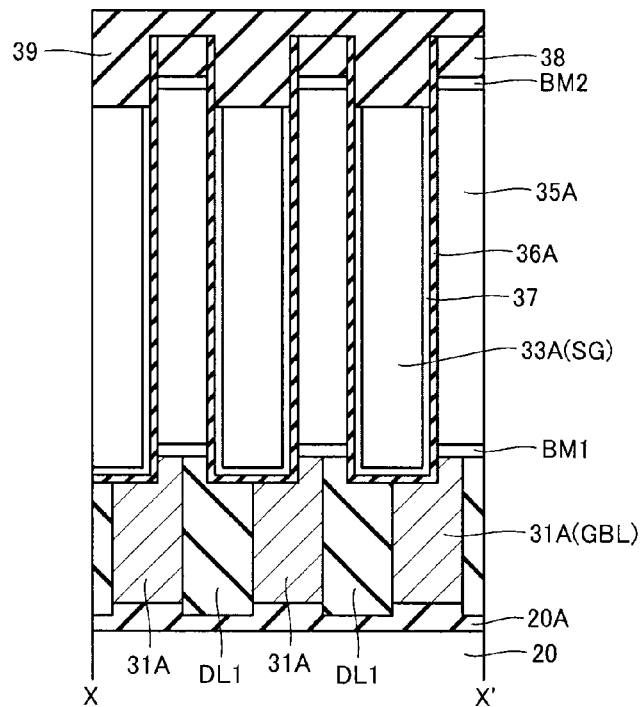
Figure 31B:
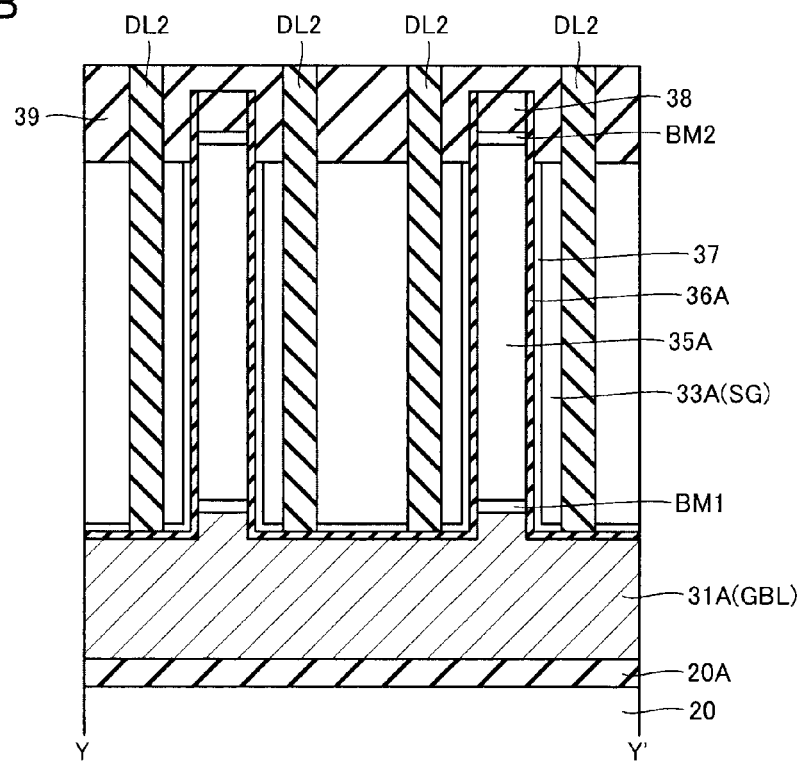

Next, as illustrated in FIG. 30A and FIG. 30B, trenches T4 are formed. The trenches T4 have the longitudinal direction in the X direction to separate the conducting layer 33A' in the Y direction. The separated conducting layers 33A' each will be the conducting layers 33A. As illustrated in FIG. 31A and FIG. 31B, by performing the CVD method or a similar method, insulating films made of a silicon oxide film or a similar film are embedded into the trenches T4, thus forming isolation insulating films DL2.

The memory layer 40 is formed on this selection transistor layer 30 by the well-known method.

In a process of forming the memory layer 40, a part of the stopper films 38 and the isolation insulating film 39 are open and are connected to the above-described columnar conducting layer 43A.

As described above, with the fourth embodiment, the columnar semiconductor layers 35A, which function as the channel for the selection transistor STr, are surrounded by the conducting layer 33A as the selection gate line SG over the whole circumference. In view of this, compared with the above-described embodiments, this embodiment improves an ON current of the selection transistor STr, ensuring increasing read signals.

Modifications of Fourth Embodiment

Figure 32:
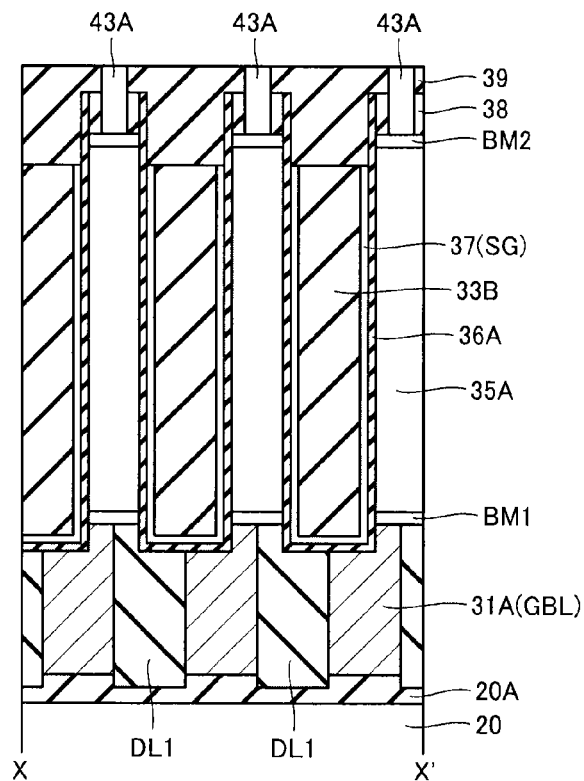
FIG. 32 and FIG. 33 illustrate modifications of the fourth embodiment.
Figure 33:
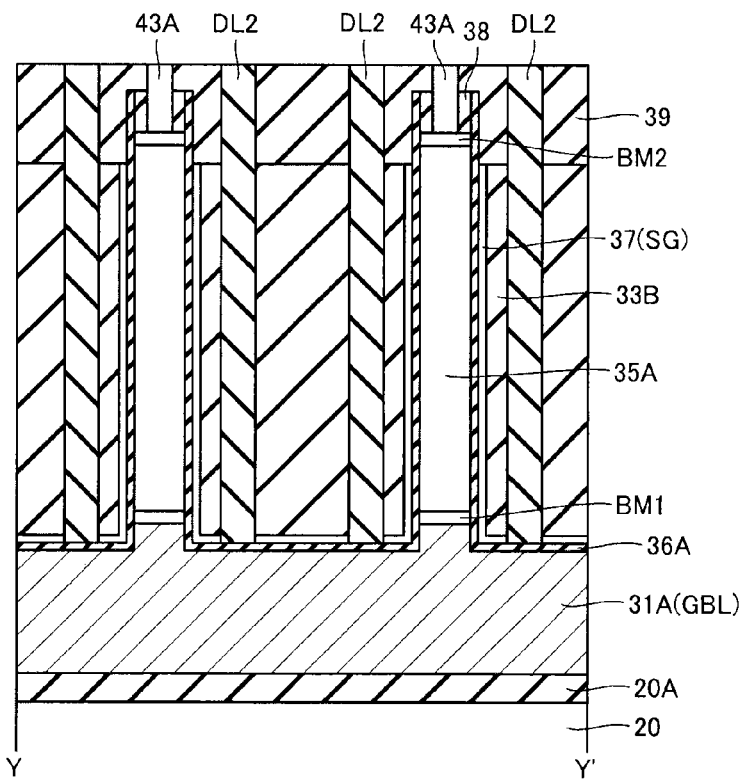

The following describes modifications of this fourth embodiment with reference to FIG. 32 and FIG. 33.

With the above-described fourth embodiment, the barrier metal film 37 and the conducting layer 33A, which is disposed adjacent to the barrier metal film 37, integrally constitute the selection gate line SG. In contrast to this, with this modification, only the barrier metal film 37 constitutes the selection gate line SG. A film 33B, which is disposed adjacent to the barrier metal film 37, is formed into an insulating film such as a silicon oxide film. The outer shape (the outline) of the film 33B may be identical to the conducting layer 33A of the fourth embodiment.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first conducting layers stacked in a first direction, the first conducting layers extending in a second direction intersecting with the first direction, the first conducting layers being arranged in a third direction, the third direction intersecting with the first direction and the second direction;
   an interlayer insulating film disposed between the first conducting layers arranged in the third direction, the interlayer insulating film extending in the first direction;
   a second conducting layer disposed between the first conducting layers arranged in the third direction, the second conducting layer extending in the first direction, the second conducting layer having an approximately circular cross-sectional shape intersecting with the first direction; and
   a variable resistance layer that surrounds a peripheral area of the second conducting layer, the variable resistance layer being disposed at a position between the second conducting layer and the first conducting layer, wherein
   a width of one of the first conducting layers in the third direction is wider than a distance between the first conducting layers adjacent in the third direction,
   a width of an outer shape of the variable resistance layer that surrounds the peripheral area of the second conducting layer, in the third direction is wider than the distance between the first conducting layers adjacent in the third direction, and
   a width of the first conducting layer in the third direction where the first conducting layer is adjacent to the variable resistance layer in the third direction is narrower than a width of the first conducting layer in the third direction where the first conducting layer is not adjacent to the variable resistance layer in the third direction.

2. The semiconductor memory device according to claim 1, wherein
   a plurality of the second conducting layers are disposed along the second direction,
   the interlayer insulating film is disposed between the second conducting layers, and
   the variable resistance layers adjacent in the second direction are disconnected at a position of the interlayer insulating film.

3. The semiconductor memory device according to claim 2, wherein
   the variable resistance layer is disposed at a position between the second conducting layer and the interlayer insulating film.

4. The semiconductor memory device according to claim 1, wherein
   a width of the interlayer insulating film in the third direction is smaller than a width of an outer shape of the variable resistance layer in the third direction, the variable resistance layer being disposed around the second conducting layer.

5. The semiconductor memory device according to claim 4, wherein
   the second conducting layer and the variable resistance layer are disposed at positions of separating the interlayer insulating film in the second direction, the variable resistance layer covering the peripheral area of the second conducting layer.

6. The semiconductor memory device according to claim 5, wherein
   a plurality of the second conducting layers adjacent in the third direction are positioned different from one another in the second direction.

7. The semiconductor memory device according to claim 1, further comprising
   a selection transistor connected to one end of the second conducting layer, wherein the selection transistor includes:
   a semiconductor layer connected to the one end of the second conducting layer, the semiconductor layer extending in the first direction; and
   a third conducting layer covering a peripheral area of the semiconductor layer via a gate insulating film.

8. The semiconductor memory device according to claim 7, further comprising
a fourth conducting layer connected to the second conducting layer via the selection transistor, the fourth conducting layer extending in the third direction, wherein
the semiconductor layer has a center position positioned displaced in the second direction with respect to a center of the fourth conducting layer.

9. The semiconductor memory device according to claim 8, further comprising
a plurality of the selection transistors connected to ends of the second conducting layers disposed along the third direction, wherein
the semiconductor layers adjacent in the third direction are disposed at positions displaced in different directions from one another with respect to the center of the fourth conducting layer.

10. A semiconductor memory device, comprising:
a plurality of first conducting layers stacked in a first direction, the first conducting layers extending in a second direction intersecting with the first direction, the first conducting layers being arranged in a third direction, the third direction intersecting with the first direction and the second direction;
an interlayer insulating film disposed between the first conducting layers arranged in the third direction, the interlayer insulating film extending in the first direction;
a columnar-shaped second conducting layer disposed between the first conducting layers arranged in the third direction, the second conducting layer extending in the first direction; and
a variable resistance layer that surrounds a peripheral area of the second conducting layer, the variable resistance layer being disposed at a position between the second conducting layer and the first conducting layer, wherein
the second conducting layer and the variable resistance layer are disposed between the first conducting layers arranged in the third direction,
the second conducting layer and the variable resistance layer are disposed at a position of separating the interlayer insulating film in the second direction,
a width of one of the first conducting layers in the third direction is wider than a distance between the first conducting layers adjacent in the third direction,
a width of an outer shape of the variable resistance layer that surrounds the peripheral area of the second conducting layer, in the third direction is wider than the distance between the first conducting layers adjacent in the third direction, and
a width of the first conducting layer in the third direction where the first conducting layer is adjacent to the variable resistance layer in the third direction is narrower than a width of the first conducting layer in the third direction where the first conducting layer is not adjacent to the variable resistance layer in the third direction.

11. The semiconductor memory device according to claim 10, wherein
the variable resistance layer is disposed around the second conducting layers, a width of an outer shape of the variable resistance layer in the third direction being larger than a width of the interlayer insulating film in the third direction.

12. The semiconductor memory device according to claim 10, wherein
a plurality of the second conducting layers are disposed along the second direction,
the interlayer insulating film is disposed between the second conducting layers, and
the variable resistance layer being disconnected at a position of the interlayer insulating film in the second direction.

13. The semiconductor memory device according to claim 12, wherein
the variable resistance layer is disposed at a position between the second conducting layer and the interlayer insulating film.

14. The semiconductor memory device according to claim 10, wherein
a plurality of the second conducting layers adjacent in the third direction are positioned different from one another in the second direction.

15. The semiconductor memory device according to claim 10, further comprising
a selection transistor connected to one end of the second conducting layer, wherein the selection transistor includes:
a semiconductor layer connected to the one end of the second conducting layer, the semiconductor layer extending in the first direction; and
a third conducting layer covering a peripheral area of the semiconductor layer via a gate insulating film.

16. The semiconductor memory device according to claim 15, further comprising a fourth conducting layer connected to the second conducting layer via the selection transistor, the fourth conducting layer extending in the third direction, wherein
the semiconductor layer has a center position positioned displaced in the second direction with respect to a center of the fourth conducting layer.

17. The semiconductor memory device according to claim 16, wherein
the semiconductor layers adjacent in the third direction are disposed at positions displaced in different directions from one another with respect to the center of the fourth conducting layer.

18. The semiconductor memory device according to claim 10, wherein
the second conducting layer and the variable resistance layer that surrounds the peripheral area of the second conducting layer have an approximately circular cross-sectional shape along the second direction and the third direction.

* * * * *